United States Patent
Takiguchi

(10) Patent No.: US 8,792,756 B2
(45) Date of Patent: Jul. 29, 2014

(54) OPTICAL SEMICONDUCTOR DEVICE

(75) Inventor: Tohru Takiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 179 days.

(21) Appl. No.: 13/572,753

(22) Filed: Aug. 13, 2012

(65) Prior Publication Data

US 2013/0136391 A1 May 30, 2013

(30) Foreign Application Priority Data

Nov. 28, 2011 (JP) ................. 2011-258462

(51) Int. Cl.
*G02B 6/12* (2006.01)
(52) U.S. Cl.
USPC ............................................ 385/14
(58) Field of Classification Search
USPC ............................................ 385/14
See application file for complete search history.

(56) References Cited

U.S. PATENT DOCUMENTS

2008/0315182 A1* 12/2008 Takada et al. ............... 257/14
2011/0091147 A1   4/2011 Hashimoto

FOREIGN PATENT DOCUMENTS

| JP | 11-307867 A | 11/1999 |
| JP | 2000-235124 A | 8/2000 |
| JP | 2011-91164 A | 5/2011 |

\* cited by examiner

*Primary Examiner* — Sung Pak
(74) *Attorney, Agent, or Firm* — Leydig, Voit & Mayer, Ltd.

(57) ABSTRACT

An optical semiconductor device includes an optical semiconductor element and an optical waveguide butt-joined to the optical semiconductor element. The optical semiconductor element has a mesa structure including an active layer and a burying layer coating side faces of the active layer. The optical waveguide has a mesa structure including an optical waveguide layer having a layer structure different from the active layer, and a burying layer coating side faces of the optical waveguide layer. Mesa width of the optical waveguide is narrower than mesa width of the optical semiconductor element.

14 Claims, 29 Drawing Sheets

COMPARATIVE EXAMPLE

SIXTH EMBODIMENT

OPTICAL SEMICONDUCTOR DEVICE

BACKGROUND OF THE INVENTION

1. Field of the Invention

The present invention relates to an optical semiconductor device wherein an optical waveguide is butt-joined to an optical semiconductor element, such as a semiconductor laser.

2. Background Art

There has been proposed an optical semiconductor device wherein an optical waveguide is butt-joined to a semiconductor laser (for example, refer to Japanese Patent Application Laid-Open No. 11-307867). In such a device, light generated in the active layer of the semiconductor laser propagates in the optical waveguide layer of the optical waveguide.

SUMMARY OF THE INVENTION

Since the active layer and the optical waveguide layer are composed of different layer structures, the light scatters in the joining portion, and leaks to the outside of the optical waveguide layer and is lost. In addition, the mode of the light scatters and the light does not efficiently join to optical fibers. As a result, there was a problem wherein the output of the light was lowered.

In view of the above-described problems, an object of the present invention is to provide an optical semiconductor device which can prevent the lowering of optical output.

According to the present invention, an optical semiconductor device includes: an optical semiconductor element; and an optical waveguide butt-joined to the optical semiconductor element, wherein the optical semiconductor element has a mesa structure including an active layer and a buried layer coating side faces of the active layer, the optical waveguide has a mesa structure including an optical waveguide layer composed of a layer structure different from the active layer and a buried layer coating side faces of the optical waveguide layer, and a mesa width of the optical waveguide is narrower than a mesa width of the optical semiconductor element.

The present invention makes it possible to prevent the lowering of optical output.

Other and further objects, features and advantages of the invention will appear more fully from the following description.

DETAILED DESCRIPTION OF THE PREFERRED EMBODIMENTS

An optical semiconductor device according to the embodiments of the present invention will be described with reference to the drawings. The same components will be denoted by the same symbols, and the repeated description thereof may be omitted.

First Embodiment

Figure 1:
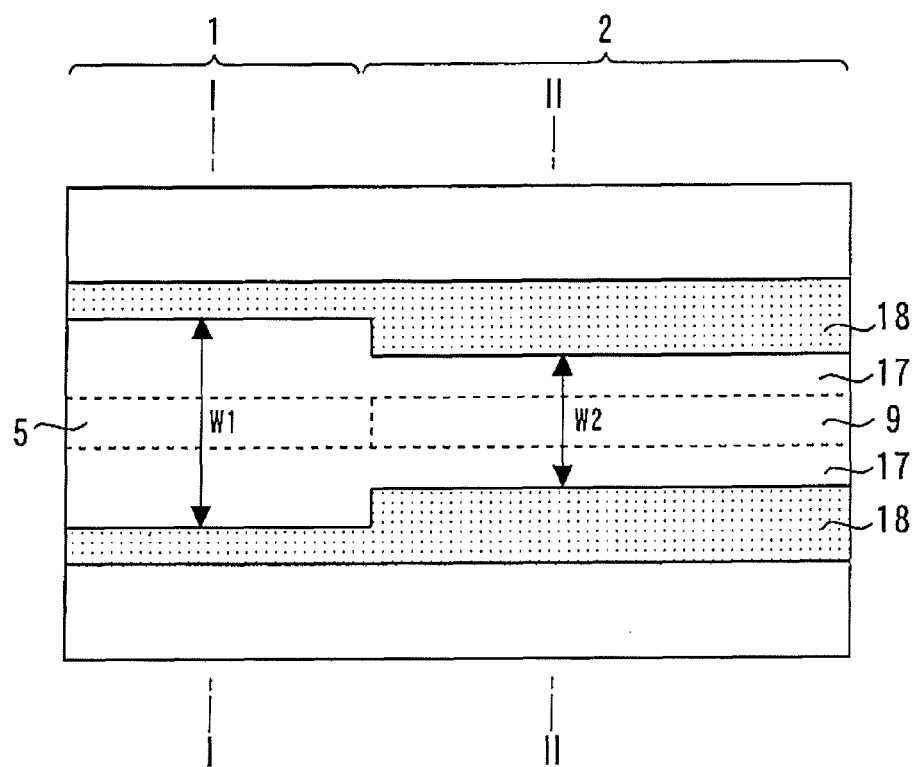
FIG. 1 is a top view showing an optical semiconductor device according to the first embodiment of the present invention.

FIG. 1 is a top view showing an optical semiconductor device according to the first embodiment of the present invention. A semiconductor laser 1 and an optical waveguide 2 are accumulated on an identical substrate, and the optical waveguide 2 is butt-joined to the semiconductor laser 1.

Figure 2:
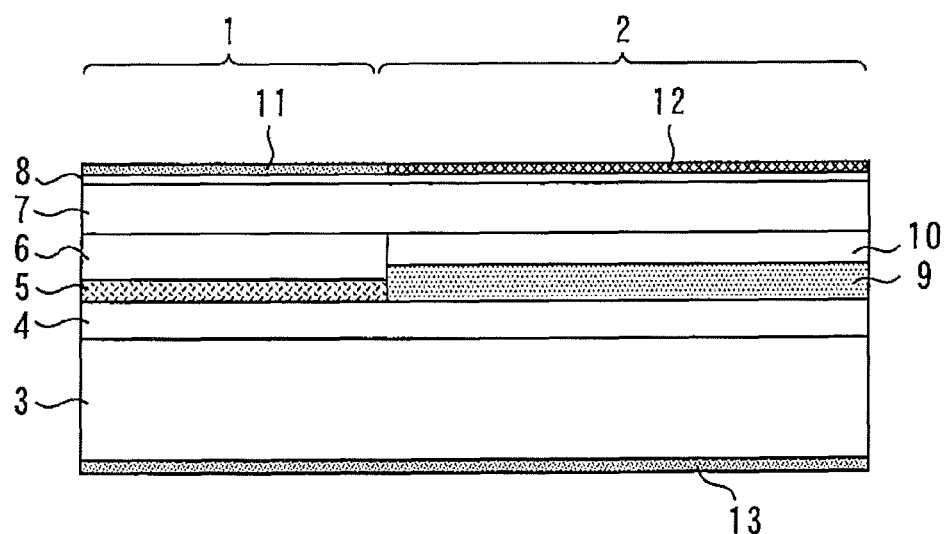
FIG. 2 is a sectional view in the resonator direction of an optical semiconductor device according to the first embodiment of the present invention.

FIG. 2 is a sectional view in the resonator direction of an optical semiconductor device according to the first embodiment of the present invention. In the semiconductor laser 1, an N-type InP clad layer 4 (impurity content: $1\times10^{18}$ cm$^{-3}$), an InGaAsP strain quantum well active layer 5, a P-type InP clad layer 6 (impurity content: $1\times10^{18}$ cm$^{-3}$), a P-type InP clad layer 7 (impurity content: $1\times10^{18}$ cm$^{-3}$), and a P-type InGaAs contact layer 8 (impurity content: $1\times10^{1}$ cm$^{-3}$) are sequentially laminated on the N-type InP substrate 3.

In an optical waveguide 2, an N-type InP clad layer 4, an AlGaInAs quantum well optical waveguide layer 9, a P-type InP clad layer 10 (impurity content: $1\times10^{18}$ cm$^{-3}$), a P-type InP clad layer 7, and a P-type InGaAs contact layer 8 are sequentially laminated on an N-type InP substrate 3.

In the semiconductor laser 1, a P-type electrode 11 is provided on the P-type InGaAs contact layer 8, and in the optical waveguide 2, an SiO$_2$ insulating film 12 is provided on the P-type InGaAs contact layer 8. An N-type electrode 13 is provided on the back face of the N-type InP substrate 3. The P-type electrode 11 and the N-type electrode 13 are composed of Ti/Pt/Au.

Figure 3:
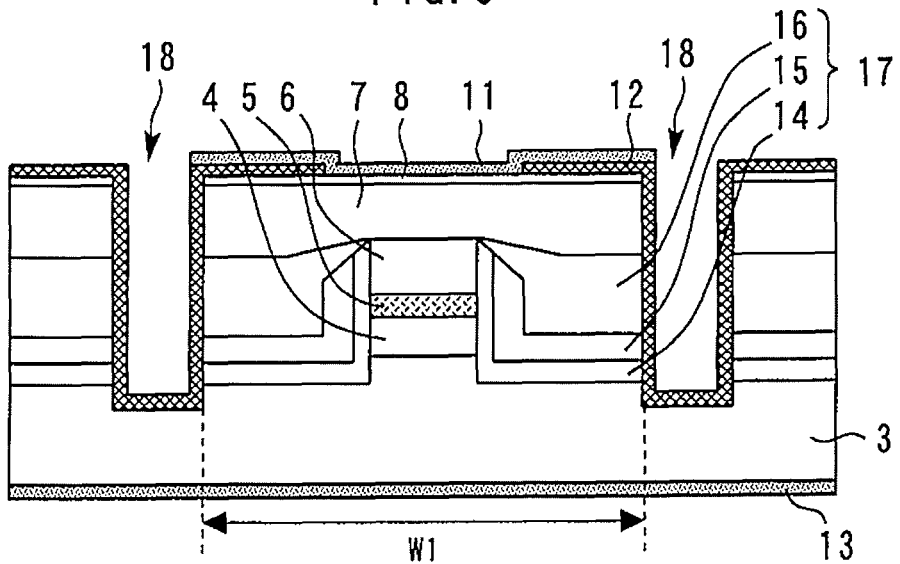
FIG. 3 is a sectional view taken along the line I-I in FIG. 1.
Figure 4:
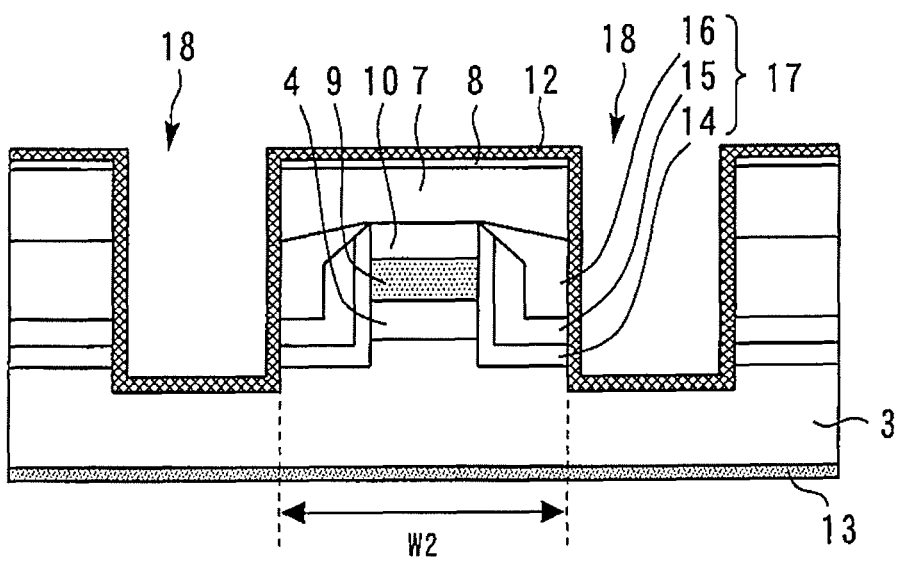
FIG. 4 is a sectional view taken along the line II-II in FIG. 1.

FIG. 3 is a sectional view taken along the line I-I in FIG. 1, and FIG. 4 is a sectional view taken along the line II-II in FIG. 1. An N-type InP clad layer 4, an InGaAsP strain quantum well active layer 5, and a P-type InP clad layer 6 constitute a ridge portion which propagates light. In addition, the N-type InP clad layer 4, an AlGaInAs quantum well optical waveguide layer 9, and a P-type InP clad layer 10 also constitute a ridge portion. A buried layer 17 composed of a P-type InP buried layer 14 (impurity content: $1\times10^{18}$ cm$^{-3}$), an N-type InP current blocking layer 15 (impurity content: $1\times10^{19}$ cm$^{-3}$), and a P-type InP current blocking layer 16 (impurity content: $1\times10^{18}$ cm$^{-3}$) laminated in this order coat the side faces of the ridge portions.

Two separating channels 18 are provided across the InGaAsP strain quantum well active layer 5 and the AlGaInAs quantum well optical waveguide layer 9 in the buried layer 17, the P-type InP clad layer 7, and the P-type InGaAs contact layer 8. The semiconductor laser 1 and the optical waveguide 2 become mesa structures between these two separating channels 18. The light is not transmitted in the outside region of the separating channels 18. The distances of the two separating channels 18 are mesa widths W1 and W2. As the feature of the present embodiment, the mesa width W2 of the optical waveguide 2 is narrower than the mesa width W1 of the semiconductor laser 1.

Next, the method for fabricating the above-described optical semiconductor device will be described. FIGS. 5 to 19 are diagrams showing the fabricating processes of the optical semiconductor device according to the first embodiment of the present invention. FIGS. 5 to 8, 10, and 16 are sectional views in the resonator direction, FIGS. 9 and 15 are top views, and FIGS. 11 to 14 and 17 to 19 are sectional views in the perpendicular direction to the resonator direction.

Figure 5:
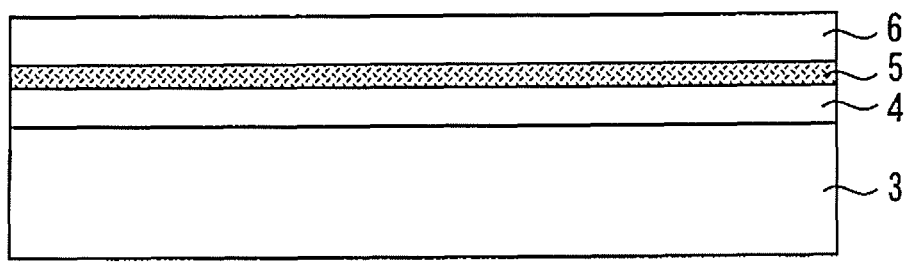
FIGS. 5 to 19 are diagrams showing the fabricating processes of the optical semiconductor device according to the first embodiment of the present invention.

Firstly, as shown in FIG. 5, on the N-type InP substrate 3, the N-type InP clad layer 4, the InGaAsP strain quantum well active layer 5, and the P-type InP clad layer 6 are formed in this order using an MOCVD method.

Figure 6:
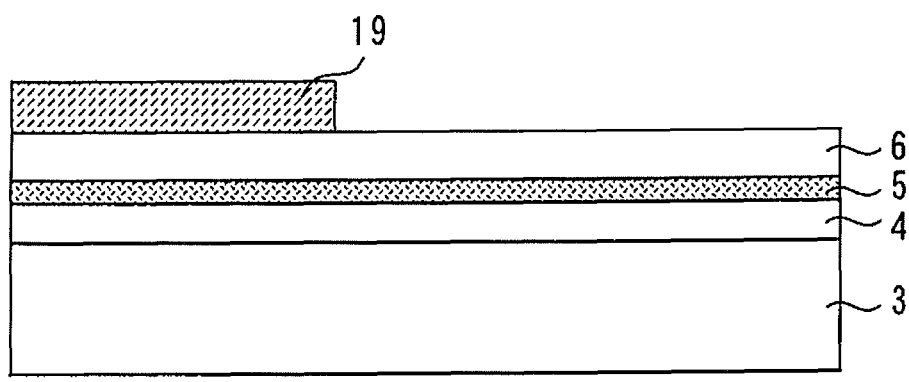

Next, as shown in FIG. 6, an SiO$_2$ insulating film 19 is patterned so as to coat the portion to be the semiconductor laser 1 later.

Figure 7:
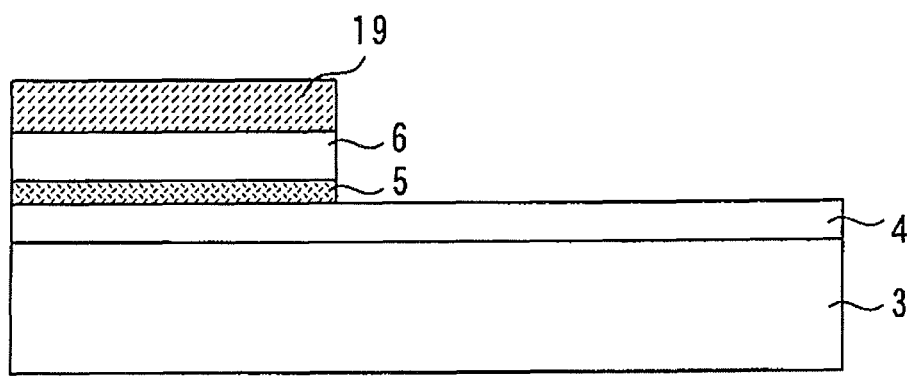

Next, as shown in FIG. 7, parts of the P-type InP clad layer 6 and the InGaAsP strain quantum well active layer 5 are removed by dry etching using the SiO$_2$ insulating film 19 as a mask. Then, the remaining InGaAsP strain quantum well active layer 5 is selectively etched to the N-type InP clad layer 4 by wet etching.

Figure 8:
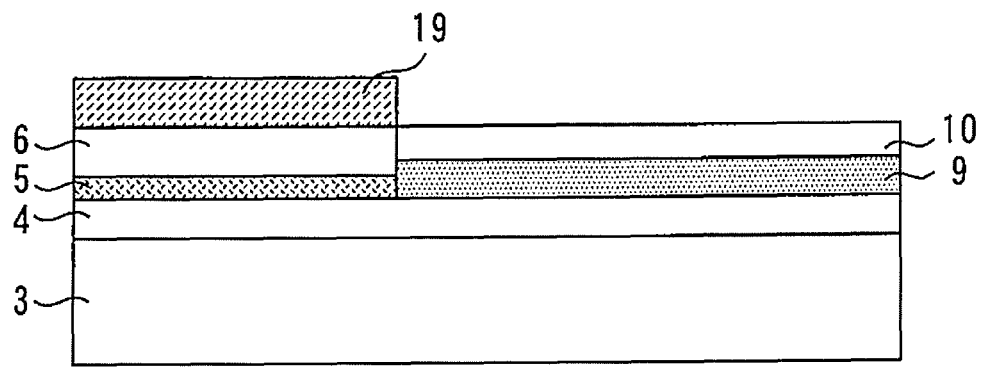
Figure 9:
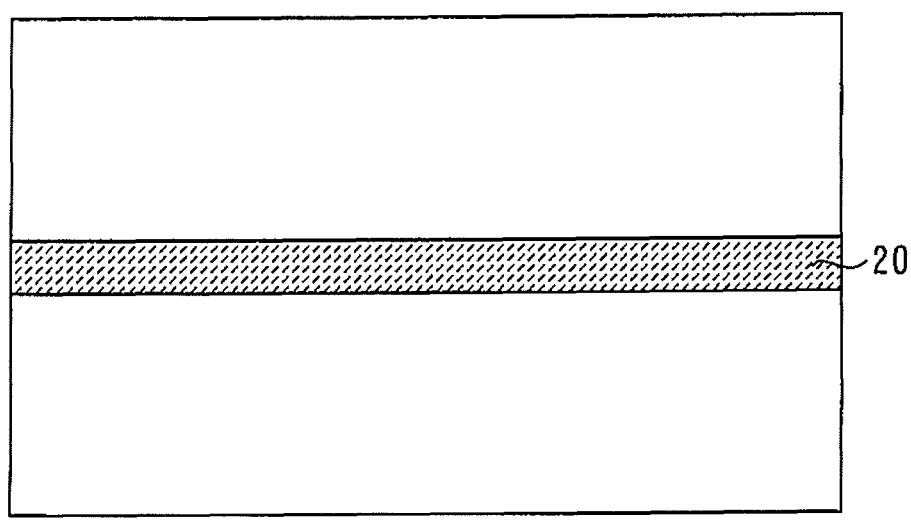

Next, as shown in FIG. 8, on the N-type InP clad layer 4, an AlGaInAs quantum well optical waveguide layer 9 and a P-type InP clad layer 10 are formed in this order using the MOCVD method.

Figure 10:
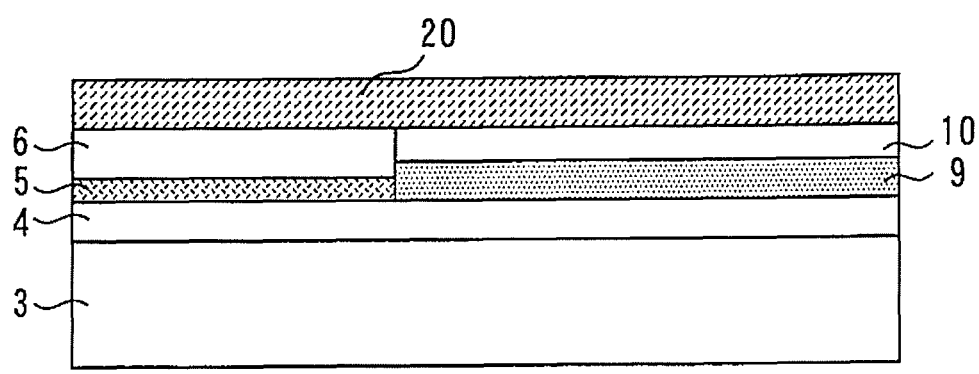
Figure 11:
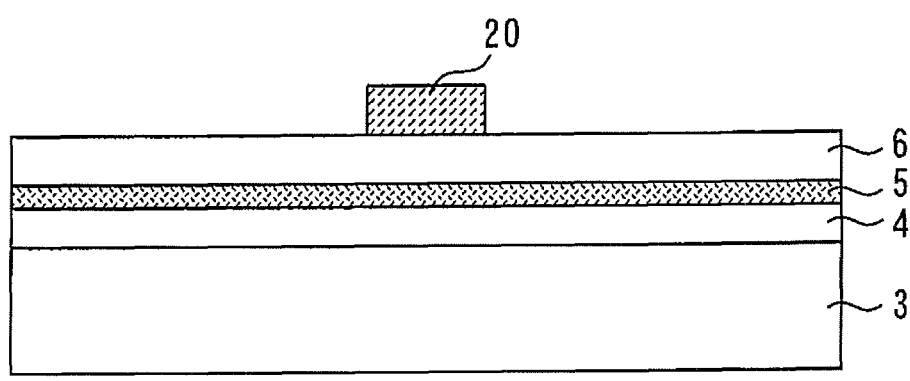

Next, as shown in FIGS. 9 to 11, after removing the SiO$_2$ insulating film 19, an SiO$_2$ insulating film 20 is patterned so as to coat the portion to be the ridge portion later.

Figure 12:
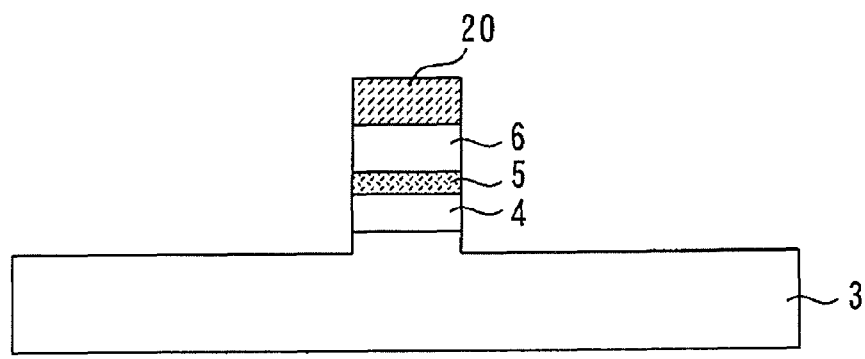

Next, as shown in FIG. 12, dry etching is performed to the middle portion of the N-type InP substrate 3 using an SiO$_2$ insulating film 20 as a mask. Thereby, the ridge portion is formed.

Figure 13:
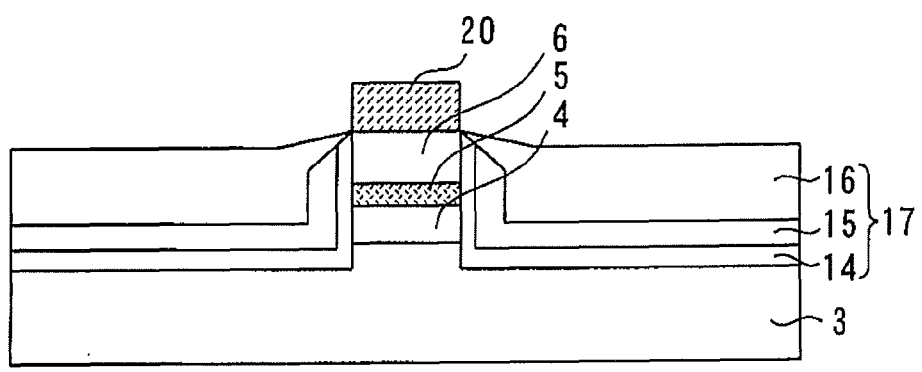

Next, as shown in FIG. 13, a buried layer 17 composed of a P-type InP buried layer 14, an N-type InP current blocking layer 15, and a P-type InP current blocking layer 16 are formed in this order using the MOCVD method.

Figure 14:
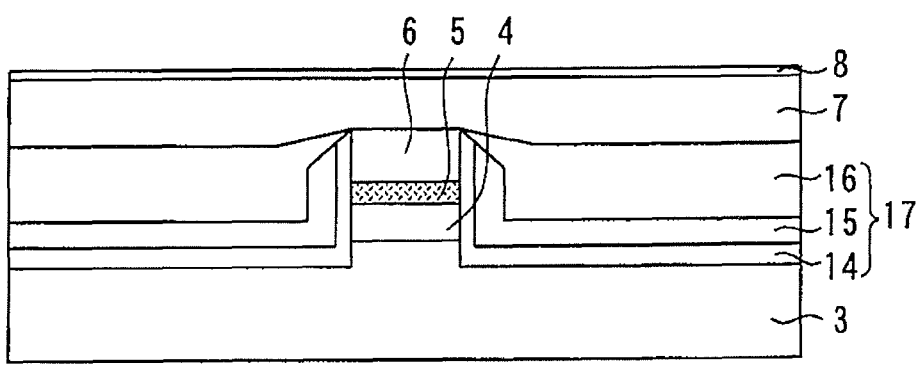
Figure 15:
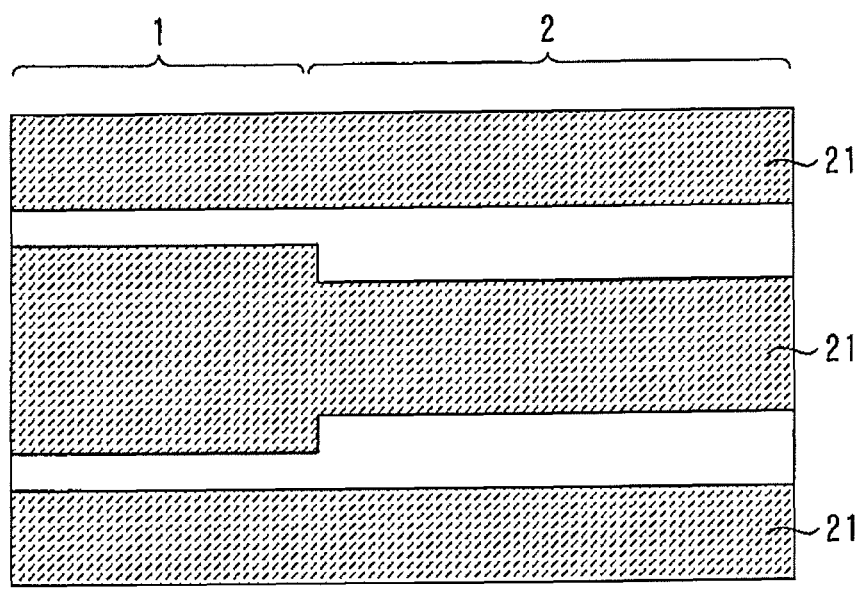

Next, as shown in FIG. 14, after removing the SiO$_2$ insulating film 20, a P-type InP clad layer 7 and a P-type InGaAs contact layer 8 are formed in this order using the MOCVD method.

Figure 16:
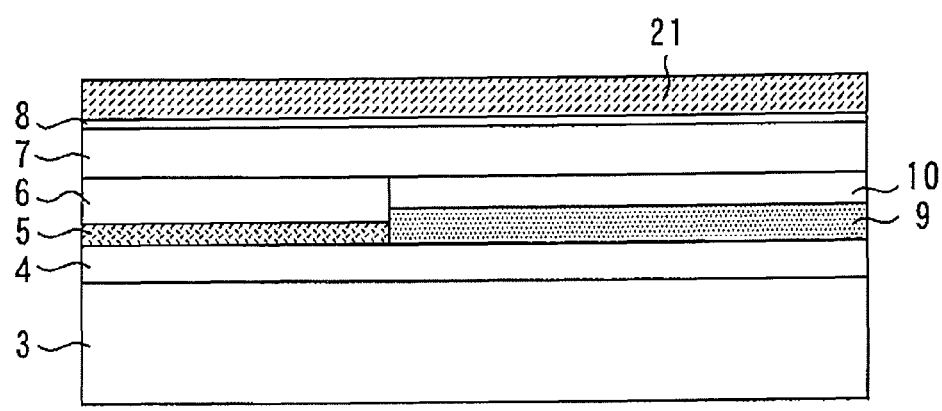
Figure 17:
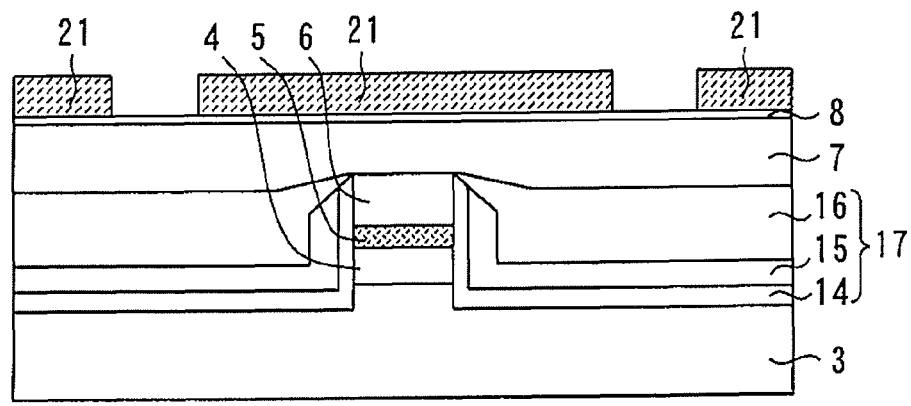

Next, as shown in FIGS. 15 to 17, an SiO$_2$ insulating film 21 is formed by patterning so as to coat portions other than the portion to be a separating channel 18 later. At this time, the width of the SiO$_2$ insulating film 21 in the optical waveguide 2 is made narrower than the width of the SiO$_2$ insulating film 21 in the semiconductor laser 1.

Figure 18:
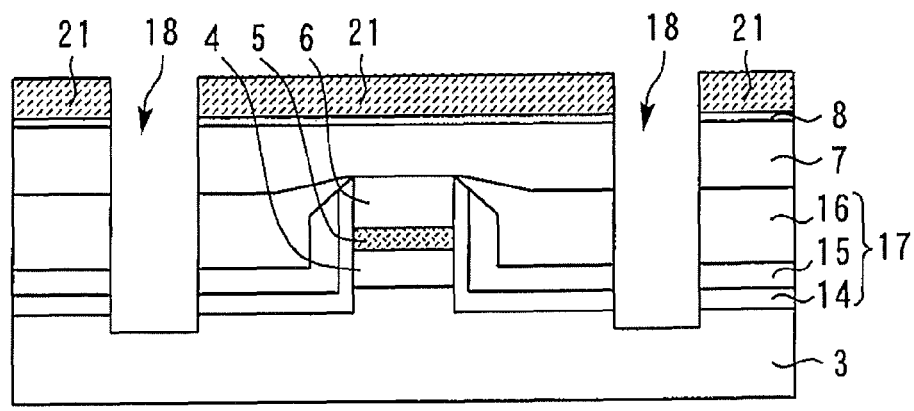
Figure 19:
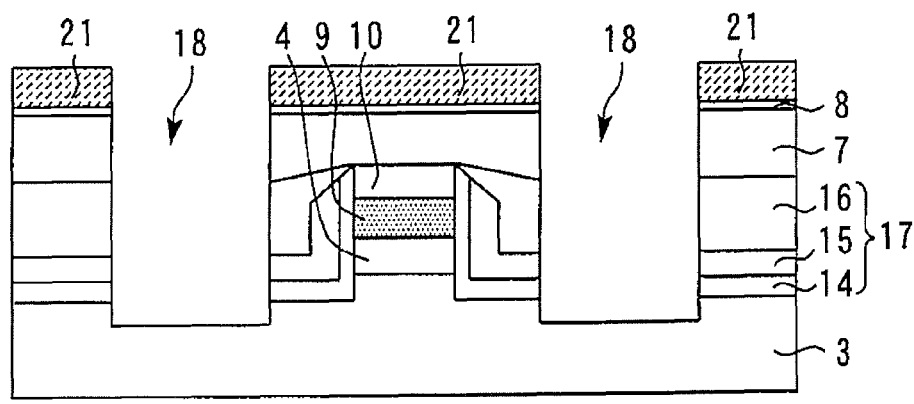

Next, as shown in FIGS. 18 and 19, the N-type InP substrate 3 is removed partway by dry etching using the SiO$_2$ insulating film 21 as a mask to form two separating channels 18. Since the SiO$_2$ insulating film 21 is made to have the above-described shape at this time, the mesa width of the optical waveguide 2 between the two separating channels 18 becomes narrower than the mesa width of the semiconductor laser 1.

Thereafter, the SiO$_2$ insulating film 21 is removed, and as shown in FIGS. 1 to 4, the SiO$_2$ insulating film 12, the P-type electrode 11, and the N-type electrode 13 are formed. By the above processes, the optical semiconductor device according to the first embodiment is fabricated.

Figure 20:
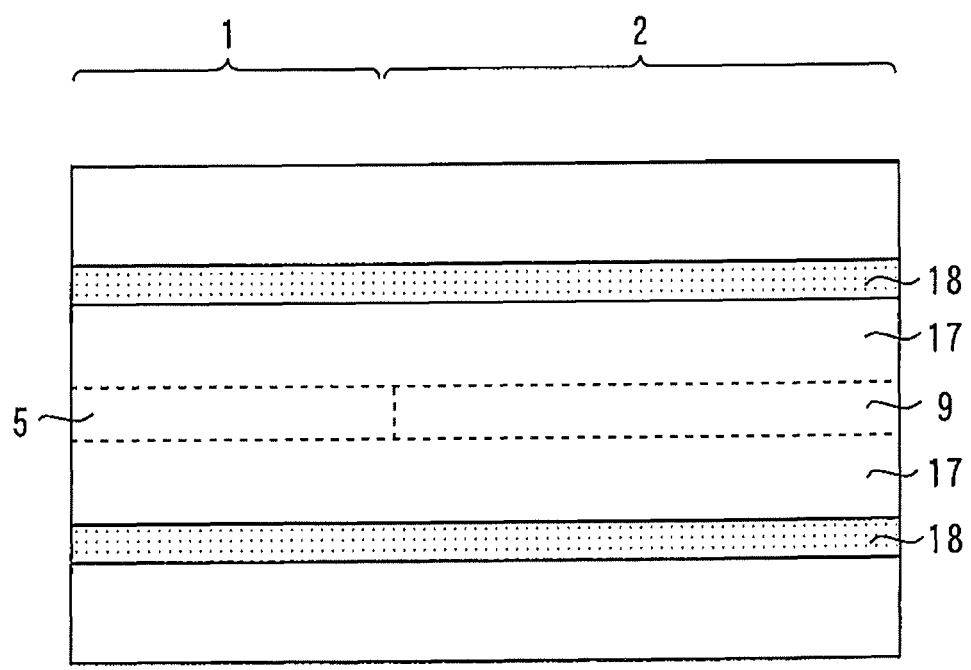
FIG. 20 is a top view showing the optical semiconductor device according to the comparative example.

Next, the effect of the first embodiment will be described in comparison with a comparative example. FIG. 20 is a top view showing the optical semiconductor device according to the comparative example. In the comparative example, the mesa width of the optical waveguide 2 is identical to the mesa width of the semiconductor laser 1. Since light is scattered at the joining portion of the InGaAsP strain quantum well active layer 5 and the AlGaInAs quantum well optical waveguide layer 9, which have different layer structures, and spread to the entire width of the mesa, the mode of the light is confused.

Figure 21:
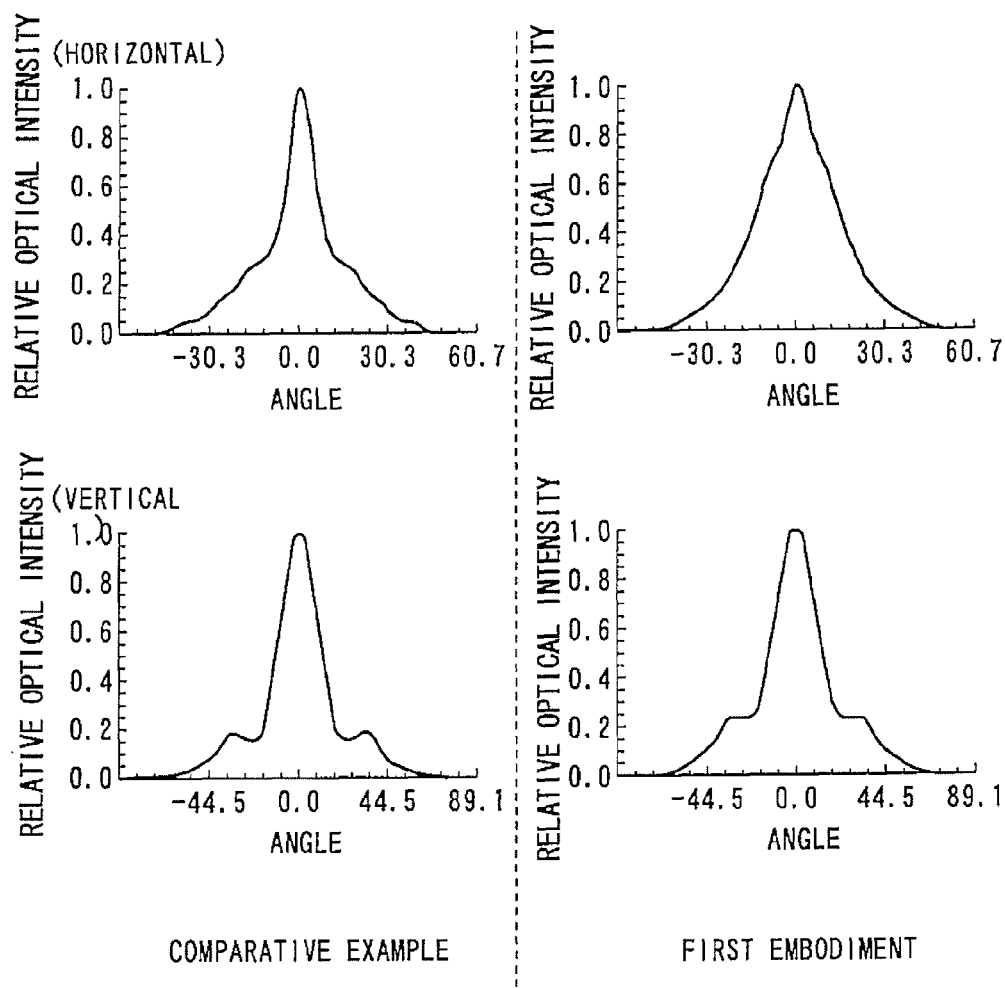
FIG. 21 is graphs showing the simulation results of the far-field images of the first embodiment and the comparative example.

On the other hand, in the first embodiment, the mesa width of the optical waveguide 2 is narrower than the mesa width of the semiconductor laser 1. Therefore, even if light spreads to the entire width of the mesa of the optical waveguide 2, since the mesa width W2 is narrow, the disturbance of the mode of the light is inhibited. FIG. 21 is graphs showing the simulation results of the far-field images of the first embodiment and the comparative example. It is seen that the first embodiment indicates that the far-field images in the horizontal direction show patterns close to Gaussian distribution. Therefore, since light efficiently bonds to optical fibers in the first embodiment, the lowering of optical output can be prevented.

Second Embodiment

Figure 22:
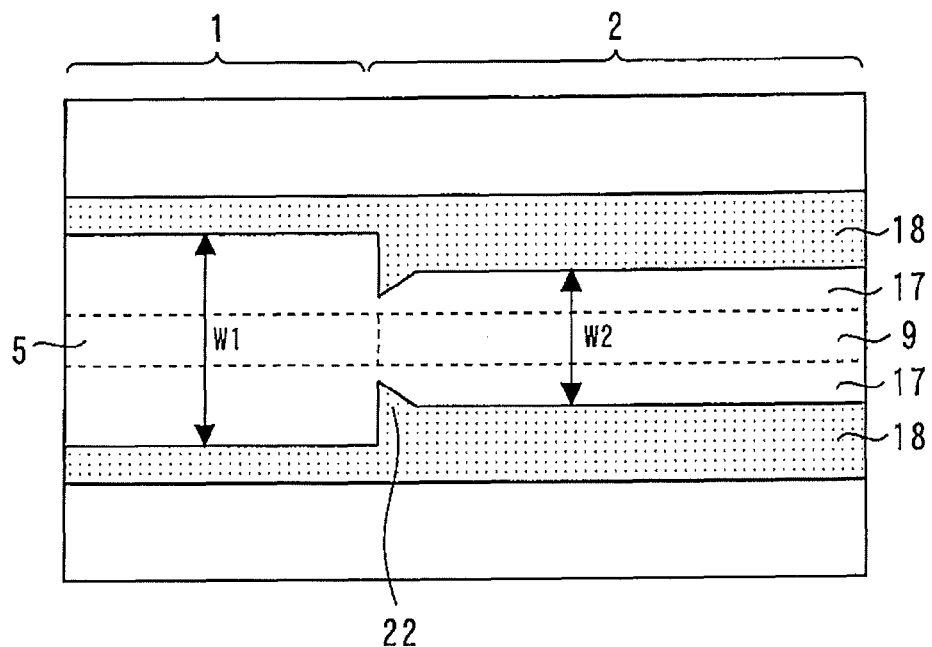
FIG. 22 is a top view showing an optical semiconductor device according to the second embodiment of the present invention.

FIG. 22 is a top view showing an optical semiconductor device according to the second embodiment of the present invention. In the vicinity of the joining portion of a semiconductor laser 1 and an optical waveguide 2, a constricted portion 22 where the mesa width is narrowed is formed in the buried layer 17 of the optical waveguide 2. Other constitutions are identical to the constitutions of the first embodiment.

The disturbance of the mode of light is inhibited as the mesa width W2 of the optical waveguide 2 is narrow. However, if the mesa width W2 of the optical waveguide 2 is too narrow, light cannot be enclosed in the mesa and is radiated out of the mesa to increase light loss. In the second embodiment, therefore, the constricted portion 22 is provided to narrow the mesa width W2 only in the vicinity of the joining portion. Thereby, the disturbance of the mode of light can be inhibited, and the radiation of the light to the exterior of the mesa can also be inhibited.

Figure 23:
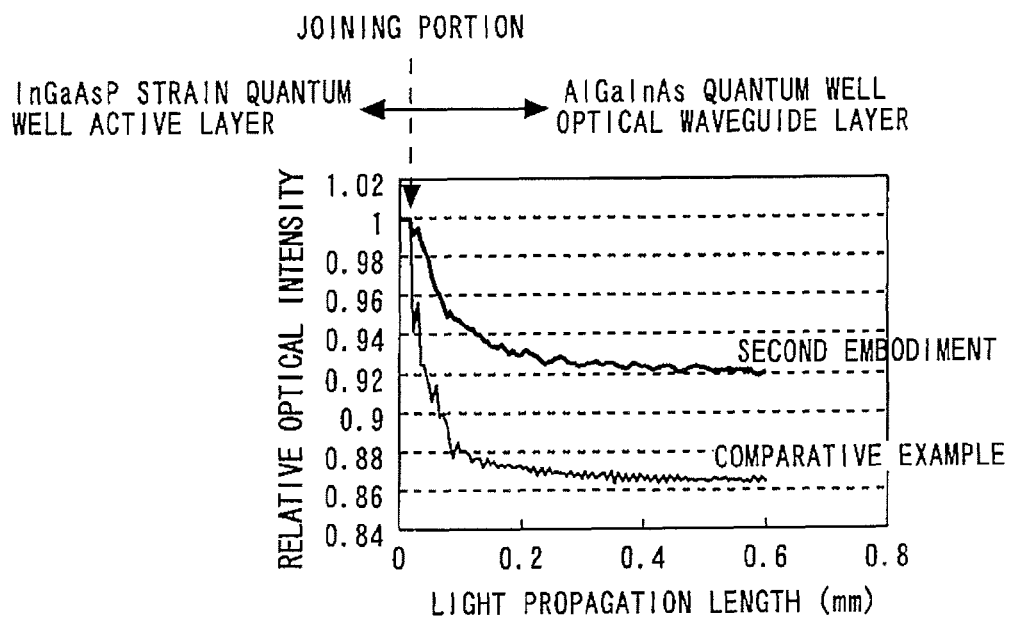
FIG. 23 is a graph showing the simulation result of light propagation in the second embodiment and the comparative example.

FIG. 23 is a graph showing the simulation result of light propagation in the second embodiment and the comparative example. It can be seen that in the second embodiment, light propagation loss decreases by about 6% in comparison to the comparative example.

Third Embodiment

Figure 24:
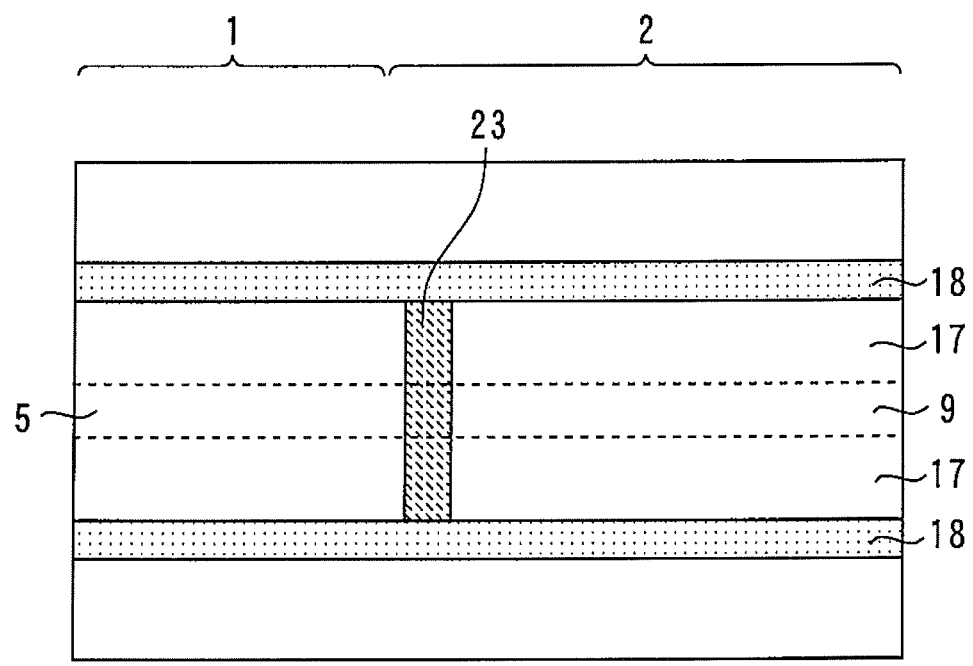
FIG. 24 is a top view showing an optical semiconductor device according to the third embodiment of the present invention.
Figure 25:
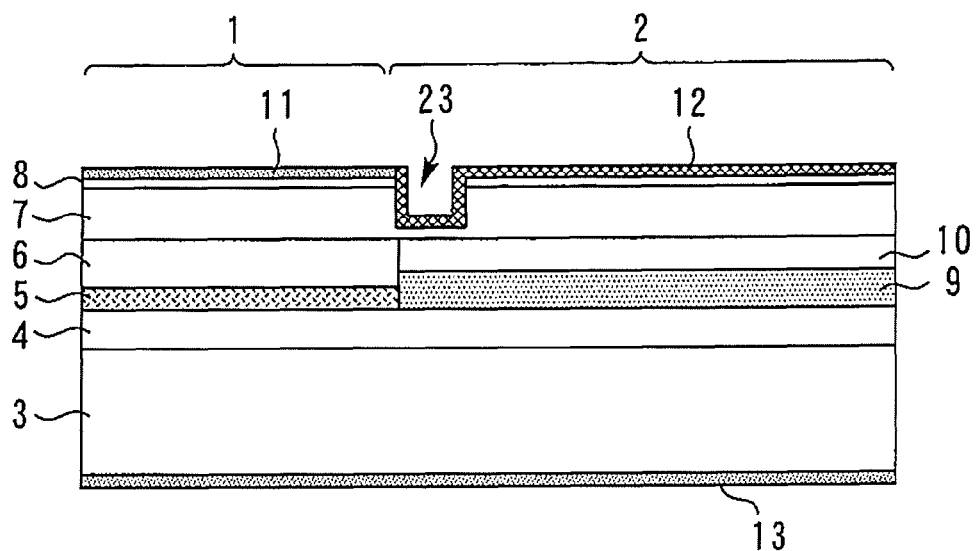
FIG. 25 is a sectional view of an optical semiconductor device according to the third embodiment of the present invention in the resonator direction.

FIG. 24 is a top view showing an optical semiconductor device according to the third embodiment of the present invention. FIG. 25 is a sectional view of an optical semiconductor device according to the third embodiment of the present invention in the resonator direction. In the vicinity of the joining portion of the semiconductor laser 1 and the optical waveguide 2, a dent portion 23 is provided in the P-type InP clad layer 7 of the optical waveguide 2.

Figure 26:
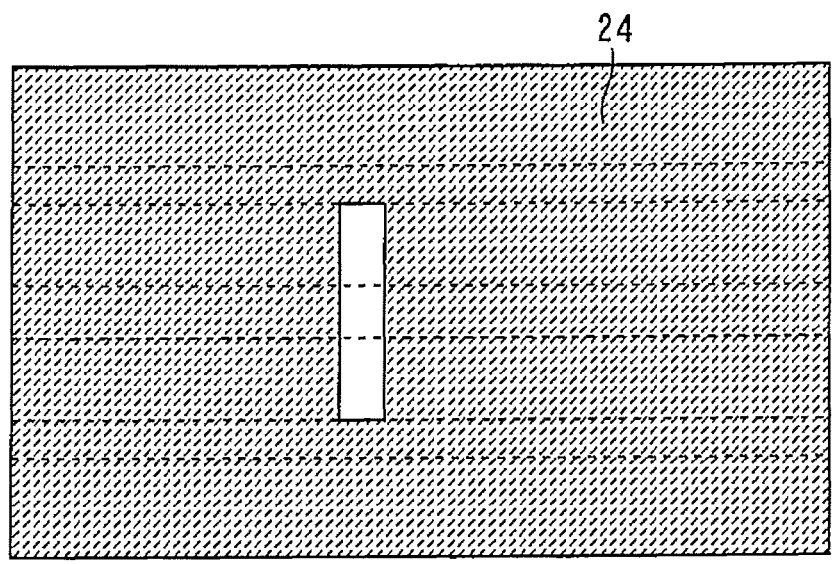
FIGS. 26 to 28 are diagrams showing the fabricating processes the optical semiconductor device according to the third embodiment of the present invention.
Figure 27:
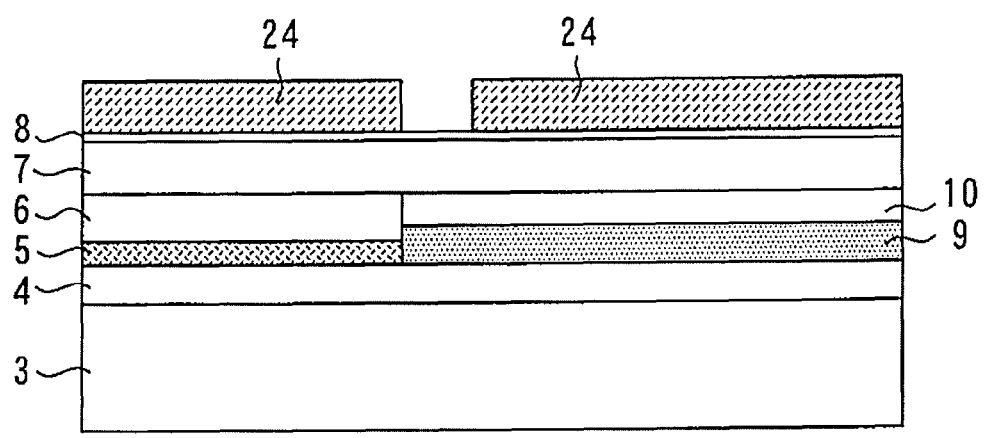
Figure 28:
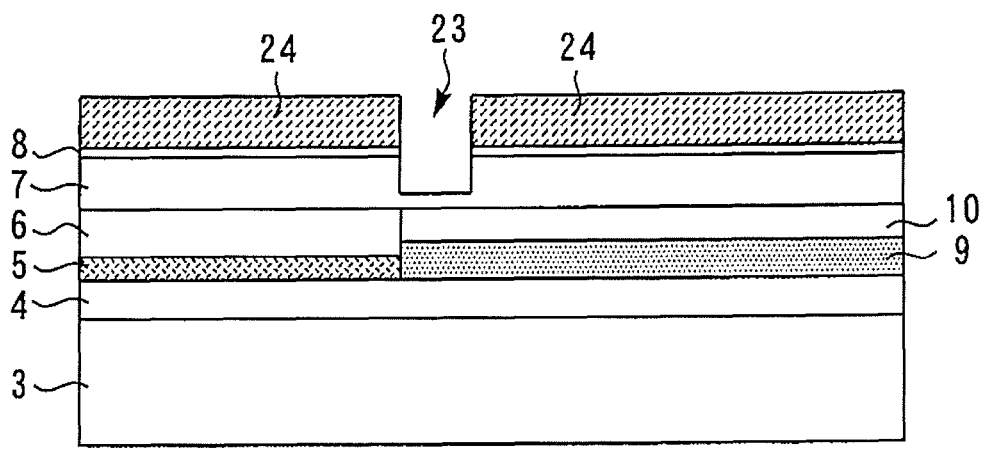

Next, the method for fabricating the above-described optical semiconductor device will be described. FIGS. 26 to 28 are diagrams showing the fabricating processes the optical semiconductor device according to the third embodiment of the present invention. FIGS. 27 and 28 are sectional views in the resonator direction, and FIG. 26 is a top view.

First, the process shown in FIGS. 5 to 19 is performed in the same manner as in the first embodiment. Thereafter, the SiO$_2$ insulating film 21 is removed, and as shown in FIGS. 26 and 27, a SiO$_2$ insulating film 24 is formed by patterning on the portion other than the portion for later forming a dent portion 23.

Next, as shown in FIG. 28, the P-type InP clad layer 7 is removed partway by dry etching using the SiO$_2$ insulating film 24 as a mask to form the dent portion 23. Thereafter, the SiO$_2$ insulating film 24 is removed, and a SiO$_2$ insulating film 12, a P-type electrode 11, and an N-type electrode 13 are formed. Through the above-described processes, the optical semiconductor device according to the third embodiment is fabricated.

Next, the effect of the third embodiment will be described. Light is scattered in the joining portion of the InGaAsP strain quantum well active layer 5 and the AlGaInAs quantum well optical waveguide layer 9 composed of different layer structures, and spreads not only in the horizontal width of the mesa, but also in the vertical direction. In the third embodiment, therefore, the dent portion 23 is provided to make the P-type InP clad layer 7 on the AlGaInAs quantum well optical waveguide layer 9 thinner. Thereby, since the scattering of light in the vertical direction can be inhibited, the disturbance of the mode of light can be inhibited. Therefore, since light is efficiently bonded to light fibers, the lowering of light output can be prevented.

Fourth Embodiment

Figure 29:
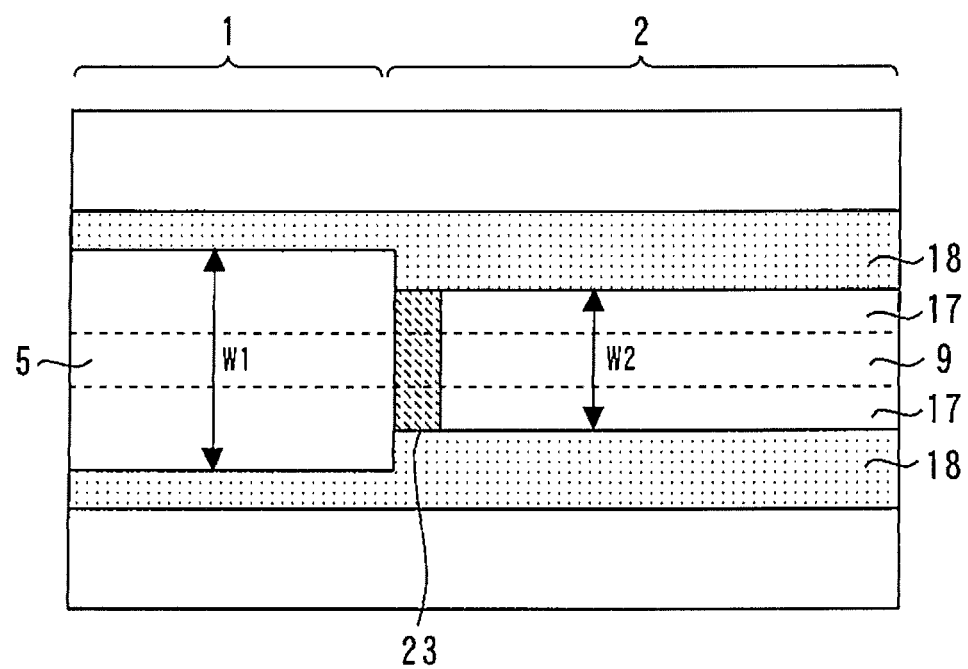
FIG. 29 is a top view showing an optical semiconductor device according to the fourth embodiment of the present invention.

FIG. 29 is a top view showing an optical semiconductor device according to the fourth embodiment of the present invention. In the same way as in the first embodiment, the mesa width of the optical waveguide 2 is narrower than the mesa width of the semiconductor laser 1, and in the same way as in the third embodiment, a dent portion 23 is provided. Thereby, since the disturbance of light in both the horizontal direction and the vertical direction can be inhibited, the effects of the first embodiment and the third embodiment can be obtained.

Figure 30:
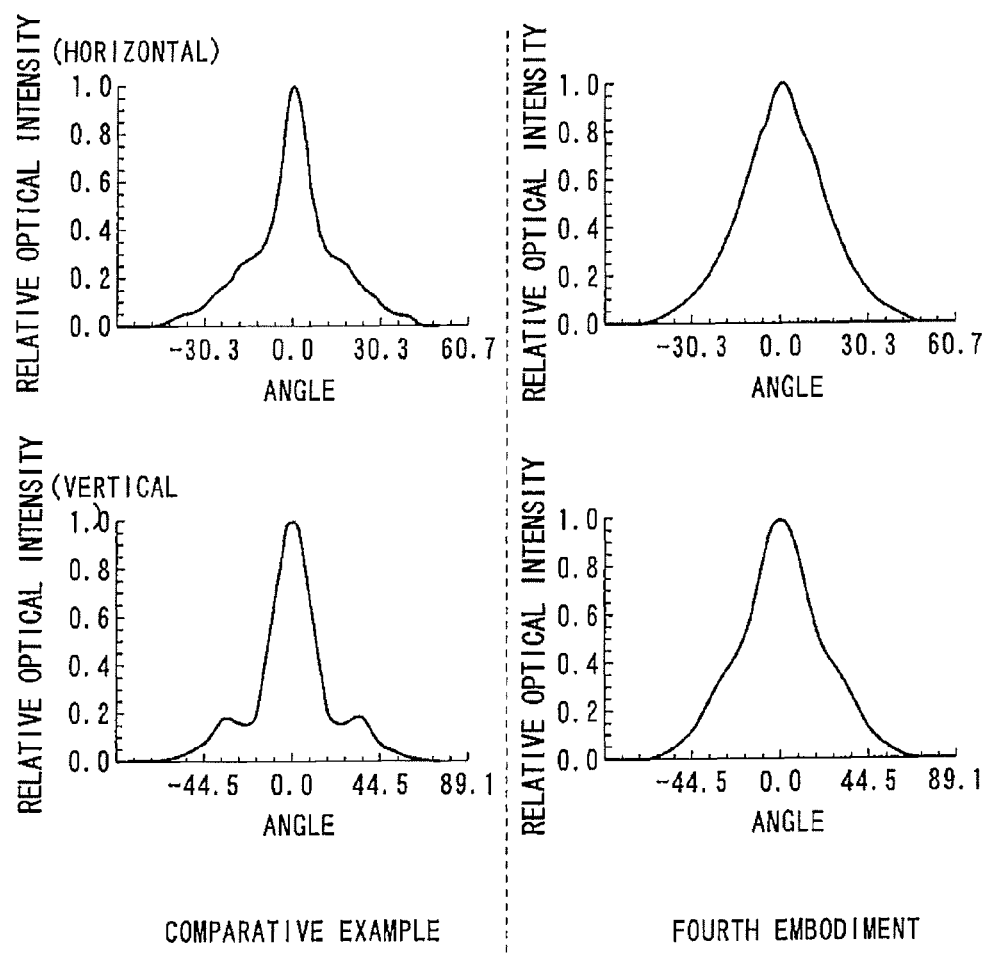
FIG. 30 is graphs showing the simulation results of the far-field images of the fourth embodiment and the comparative example.

FIG. 30 is graphs showing the simulation results of the far-field images of the fourth embodiment and the comparative example. It is seen that the fourth embodiment indicates that the far-field images in both the horizontal direction and the vertical direction show patterns close to Gaussian distribution. Therefore, since light efficiently bonds to optical fibers in the fourth embodiment, the lowering of optical output can be prevented.

Figure 31:
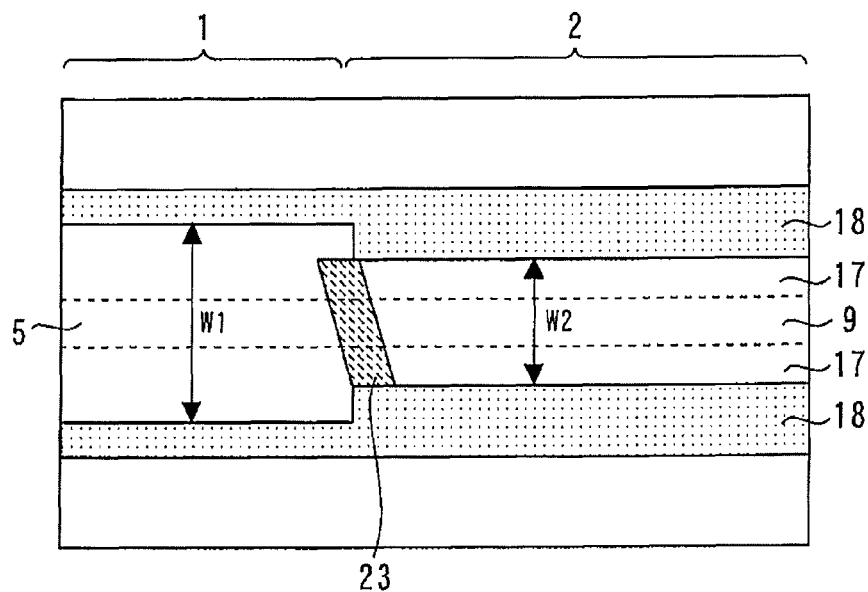
FIG. 31 is a top view showing a deformation example of an optical semiconductor device according to the fourth embodiment of the present invention.

FIG. 31 is a top view showing a deformation example of an optical semiconductor device according to the fourth embodiment of the present invention. When light reflected at the dent portion 23 returns to the semiconductor laser 1, there are adverse effects wherein the line width of the laser is widened, and the kink generates in the optical current-optical output characteristics. In the deformation example, therefore, the dent portion 23 is inclined for 45 degrees to the resonator direction of the semiconductor laser 1. Thereby, since the light reflected at the dent portion 23 does not return to the semiconductor laser 1 and is radiated out of the waveguide, the above-described adverse effects can be inhibited.

Fifth Embodiment

Figure 32:
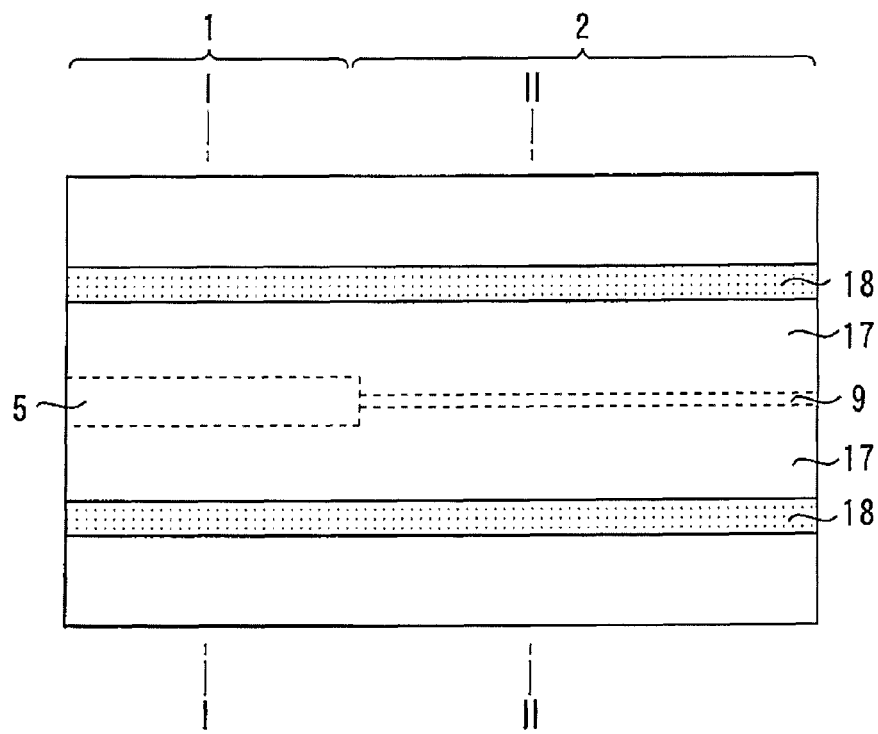
FIG. 32 is a top view showing an optical semiconductor device according to the fifth embodiment of the present invention.
Figure 33:
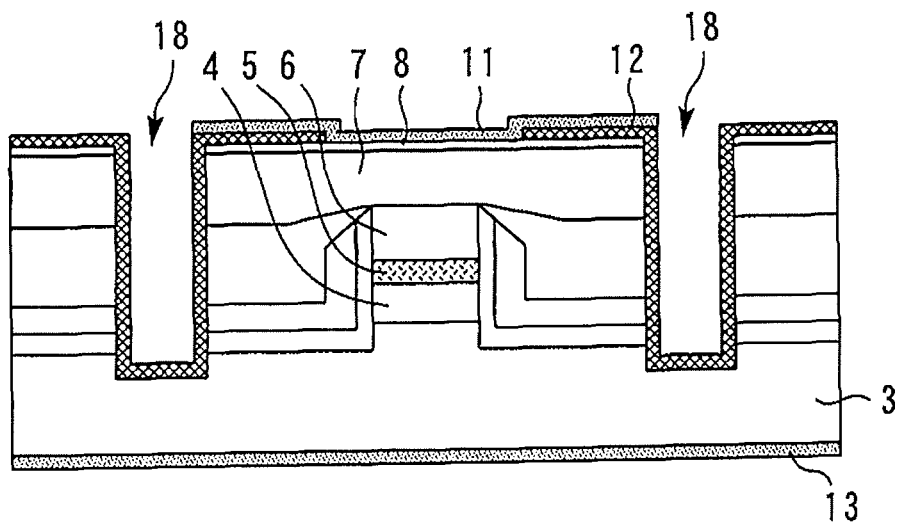
FIG. 33 is a sectional view taken along the line I-I in FIG. 32.
Figure 34:
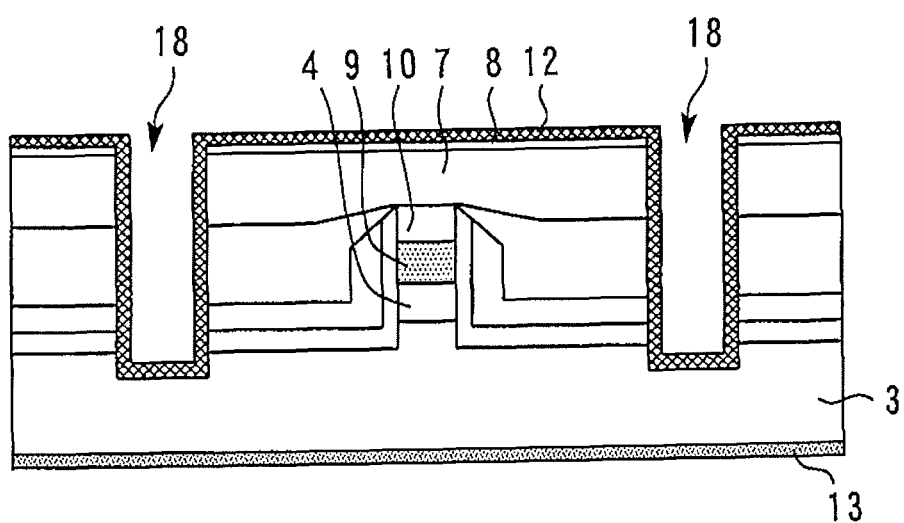
FIG. 34 is a sectional view taken along the line II-II in FIG. 32.

FIG. 32 is a top view showing an optical semiconductor device according to the fifth embodiment of the present invention. FIG. 33 is a sectional view taken along the line I-I in FIG. 32, and FIG. 34 is a sectional view taken along the line II-II in FIG. 32.

In the fifth embodiment, the width of the AlGaInAs quantum well optical waveguide layer 9 having a large refractive index is narrowed comparing to the width of the InGaAsP strain quantum well active layer 5 to agree the effective refractive indices of the InGaAsP strain quantum well active layer 5 and the AlGaInAs quantum well optical waveguide layer 9.

Figure 35:
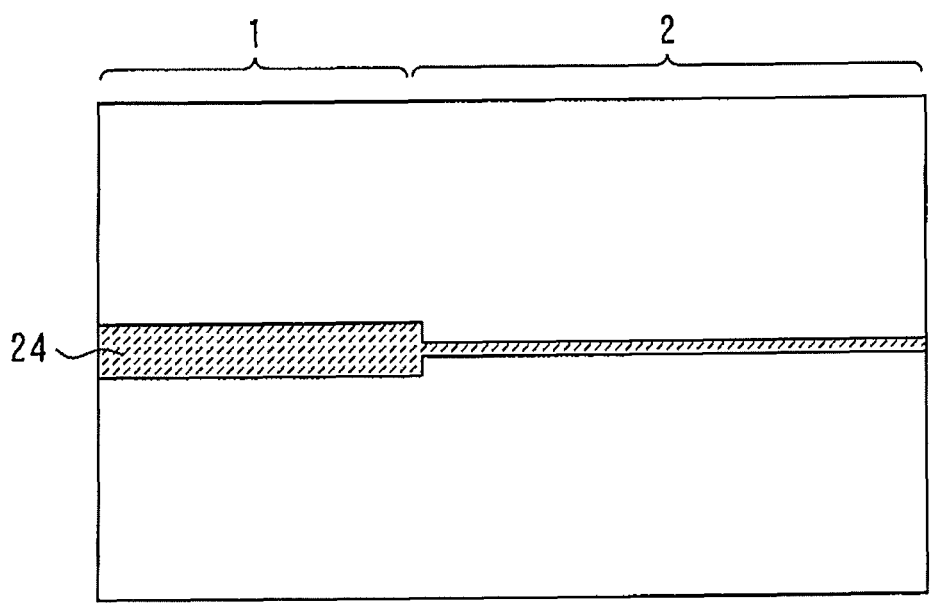
FIGS. 35 to 39 are diagrams showing a fabricating process of an optical semiconductor device according to the fifth embodiment of the present invention.
Figure 36:
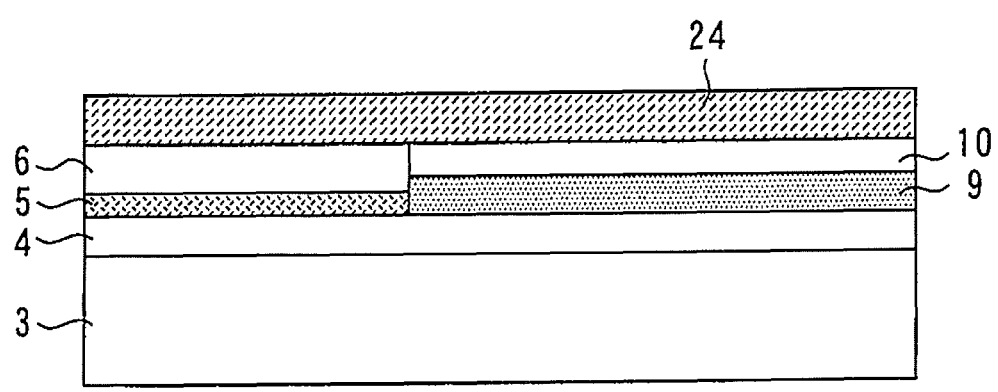
Figure 37:
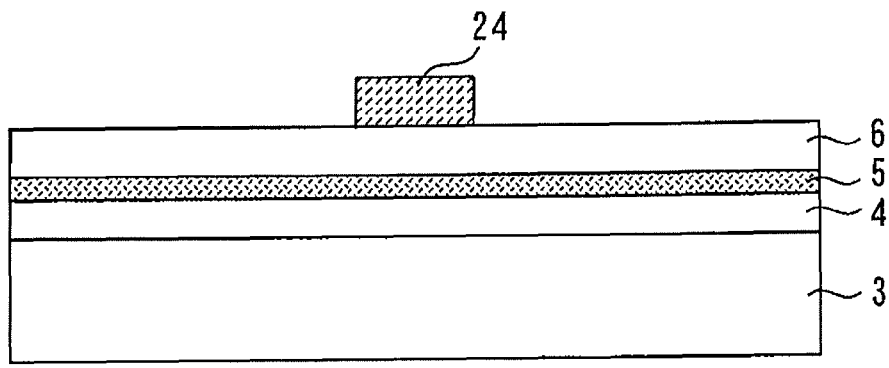
Figure 38:
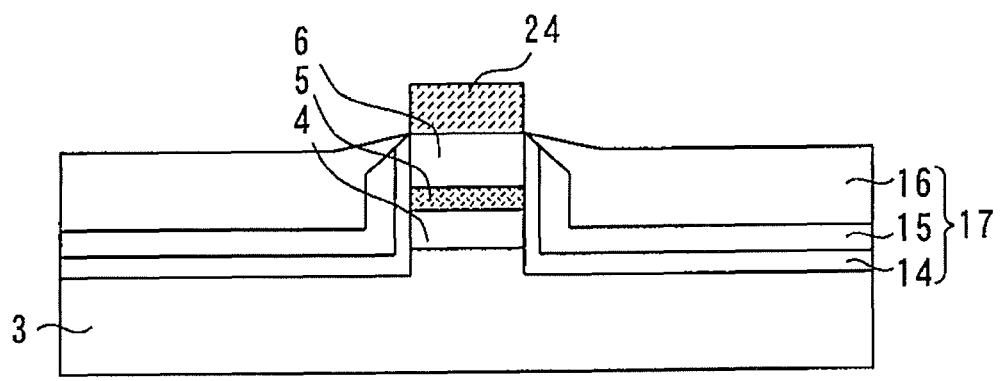
Figure 39:
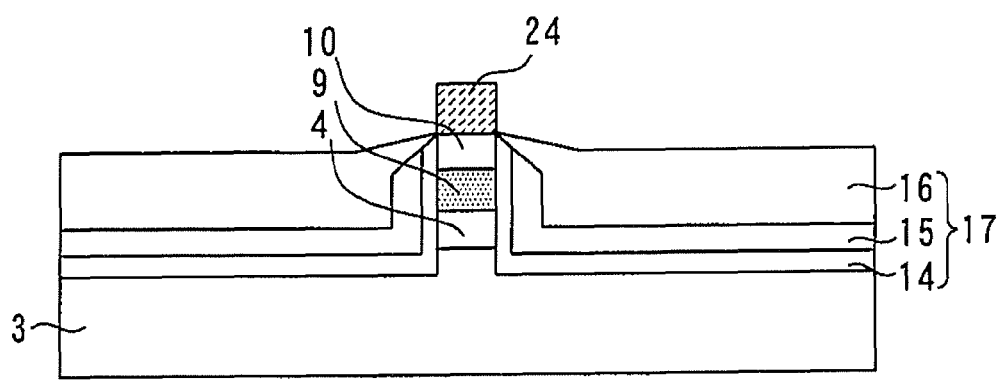

Next, the method for fabricating the above-described optical semiconductor device will be described. FIGS. 35 to 39 are diagrams showing a fabricating process of an optical semiconductor device according to the fifth embodiment of the present invention. FIG. 36 is a sectional view in the resonator direction, FIG. 35 is a top view, and FIGS. 37 to 39 are sectional views in the perpendicular direction to the resonator direction.

First, processes shown in FIGS. 5 to 8 are performed in the same manner as the processes in the first embodiment. Thereafter, the SiO₂ insulating film 19 is removed, and as shown in FIGS. 35 to 37, the SiO₂ insulating film 24 is formed by patterning so as to coat the portion later to be the ridge portion. At this time, the width of the SiO₂ insulating film 24 in the optical waveguide 2 is made to be narrower than the width of the SiO₂ insulating film 24 in the semiconductor laser 1.

Next, as shown in FIGS. 38 and 39, using the SiO₂ insulating film 24 as a mask, the N-type InP substrate 3 is removed by dry etching to the middle. At this time, since the SiO₂ insulating film 24 is made to have the above-described shape, the width of the AlGaInAs quantum well optical waveguide layer 9 becomes narrower than the width of the InGaAsP strain quantum well active layer 5. Then, the P-type InP buried layer 14, the N-type InP current blocking layer 15, and the P-type InP current blocking layer 16 are sequentially formed using the MOCVD method. The subsequent processes are identical to the processes in the first embodiment.

In the fifth embodiment, since the widths of the InGaAsP strain quantum well active layer 5 and the AlGaInAs quantum well optical waveguide layer 9 are changed to agree the effective refractive indices, the disturbance of the light in the joining portion of both is decreased. Therefore, the loss of light decreases, and the lowering of optical output can be prevented. However, since change in the widths of both is insufficient, the effective refraction indices of both must be matched.

Figure 40:
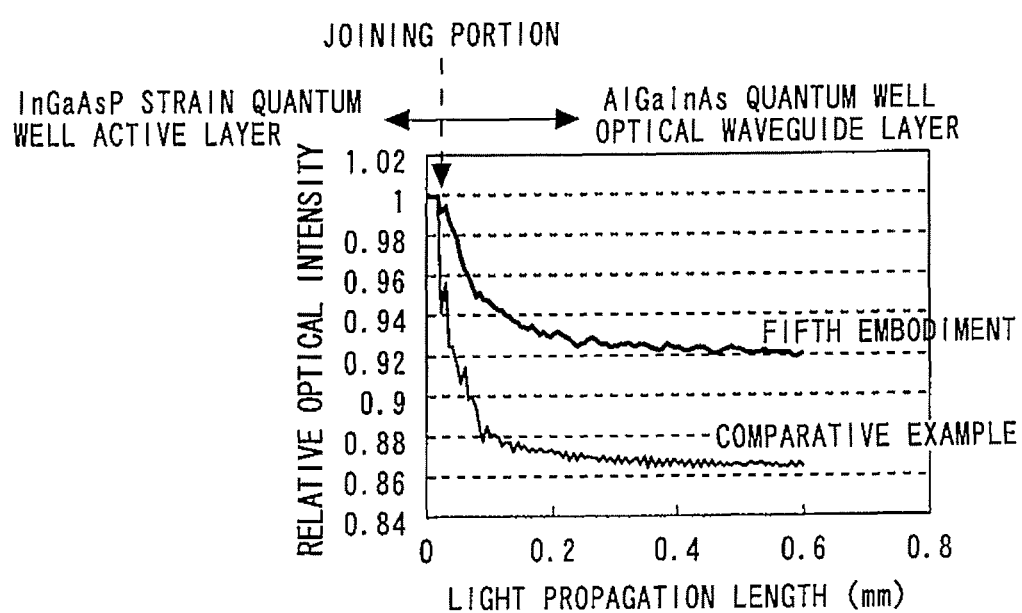
FIG. 40 is a graph showing the results of the simulation of light propagation in the fifth embodiment and the comparative example.

FIG. 40 is a graph showing the results of the simulation of light propagation in the fifth embodiment and the comparative example. In the fifth embodiment, it is seen that the light propagation loss decreases by about 6% in comparison with the comparative example.

Figure 41:
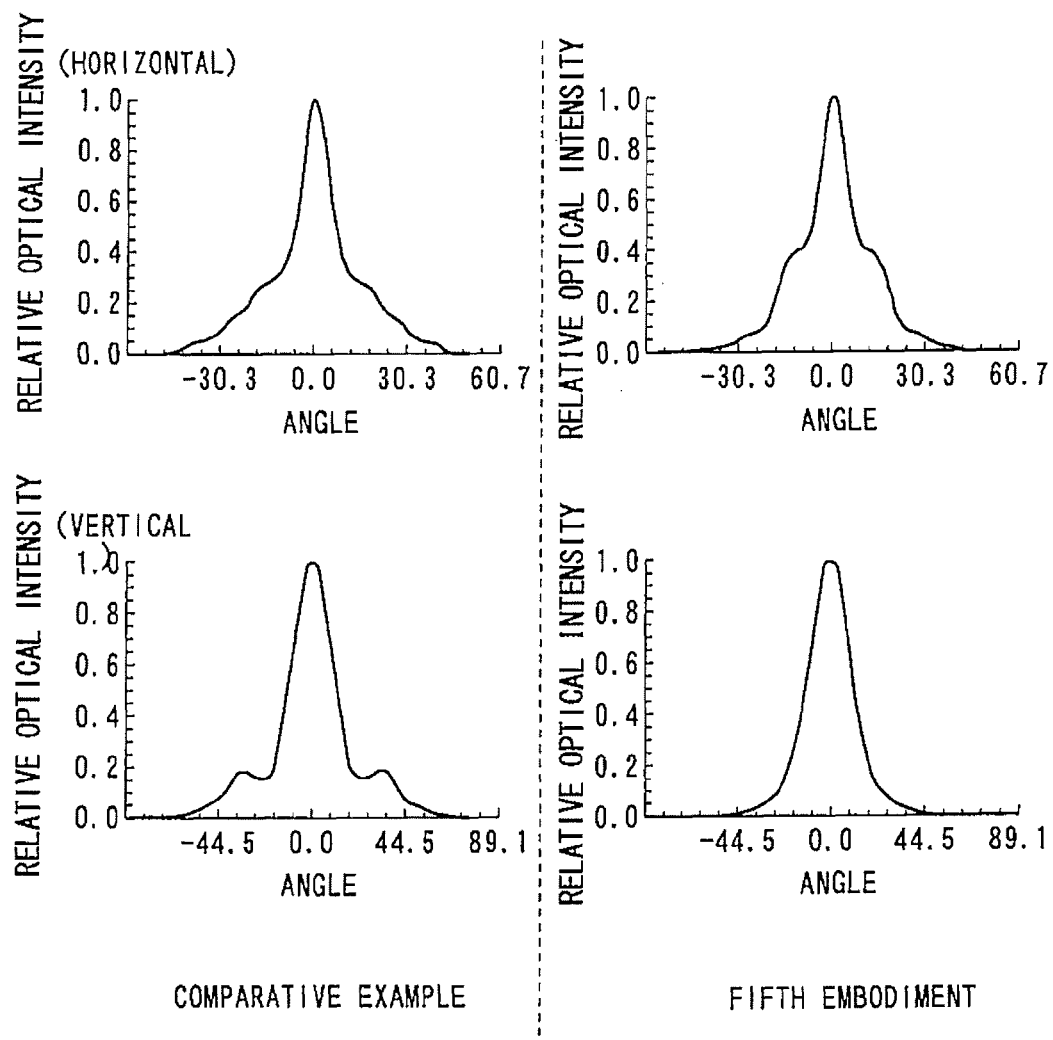
FIG. 41 is graphs showing the simulation results of the far-field images of the fifth embodiment and the comparative example.

FIG. 41 is graphs showing the simulation results of the far-field images of the fifth embodiment and the comparative example. It is seen that the fifth embodiment indicates that the far-field images in the vertical direction show patterns close to Gaussian distribution. Therefore, since light efficiently bonds to optical fibers in the fifth embodiment, the lowering of optical output can be prevented.

Sixth Embodiment

Figure 42:
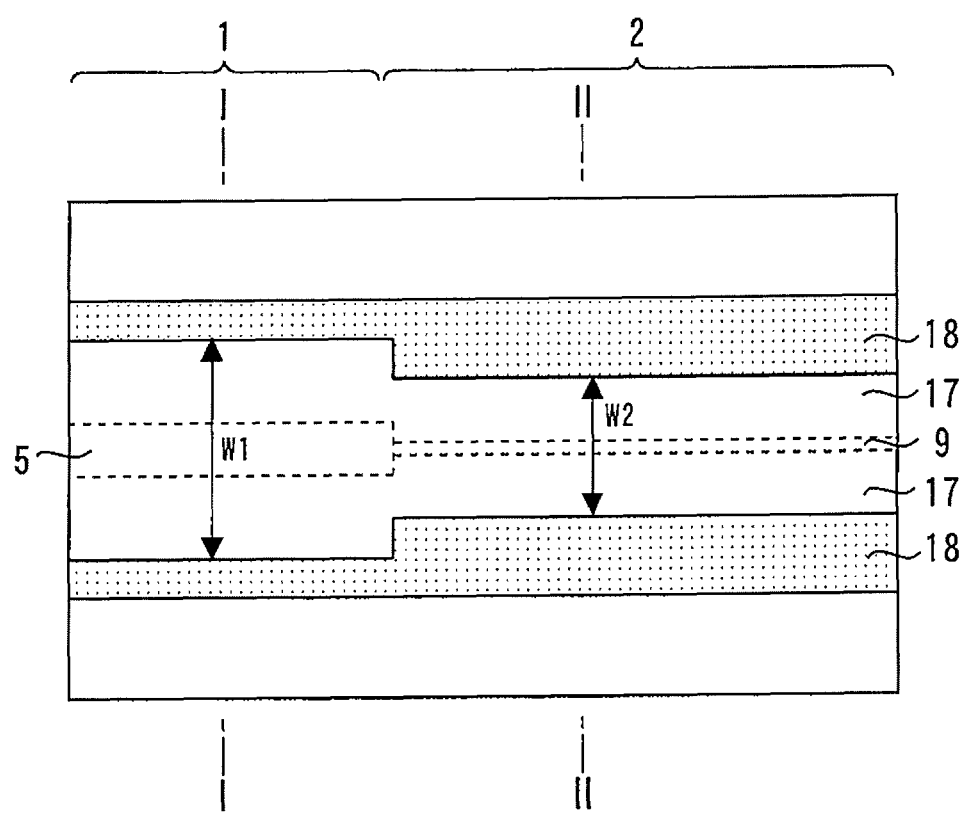
FIG. 42 is a top view showing an optical semiconductor device according to the sixth embodiment of the present invention.
Figure 43:
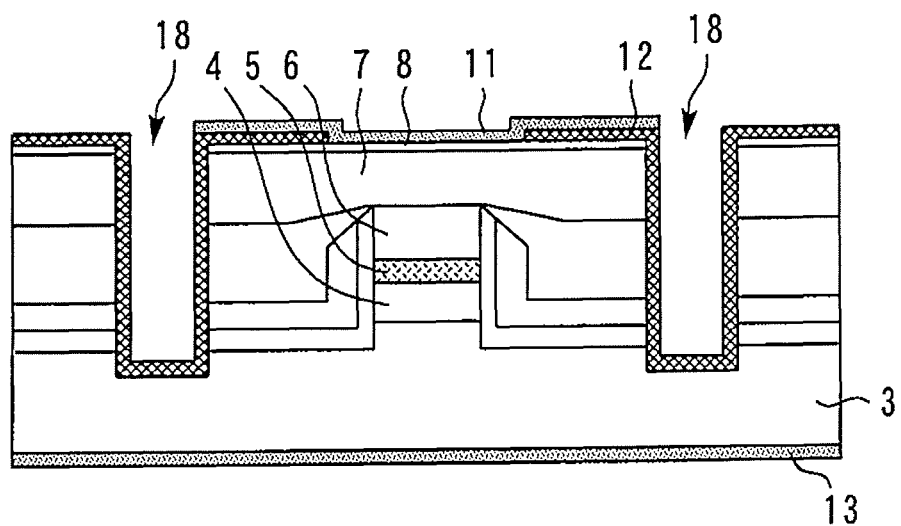
FIG. 43 is a sectional view taken along the I-I in FIG. 42.
Figure 44:
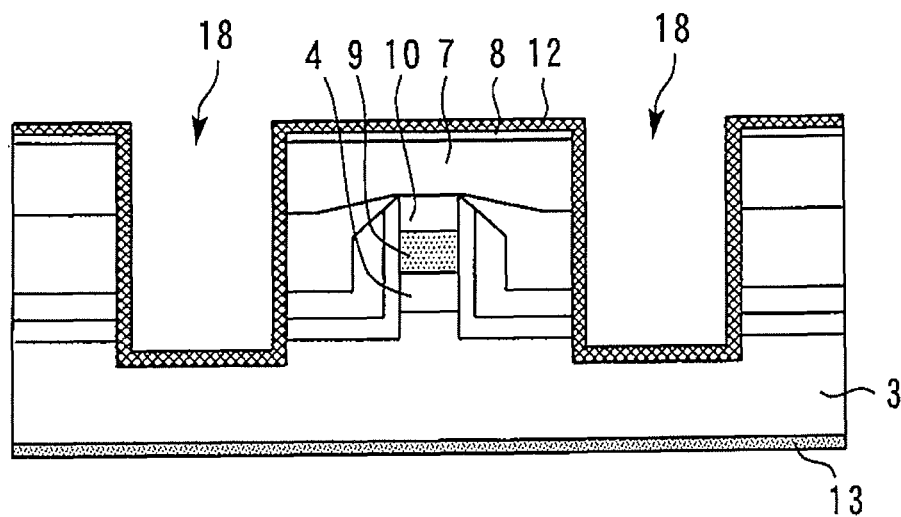
FIG. 44 is a sectional view taken along the II-II in FIG. 42.

FIG. 42 is a top view showing an optical semiconductor device according to the sixth embodiment of the present invention. FIG. 43 is a sectional view taken along the I-I in FIG. 42, and FIG. 44 is a sectional view taken along the II-II in FIG. 42.

In the same manner as in the first embodiment, the mesa width of the optical waveguide 2 is narrower than the mesa width in the semiconductor laser 1, and in the same manner as in the fifth embodiment, the widths of the InGaAsP strain quantum well active layer 5 and the AlGaInAs quantum well optical waveguide layer 9 are changed to agree the effective refraction indices. Thereby, the effects of the first embodiment and the fifth embodiment can be obtained.

Figure 45:
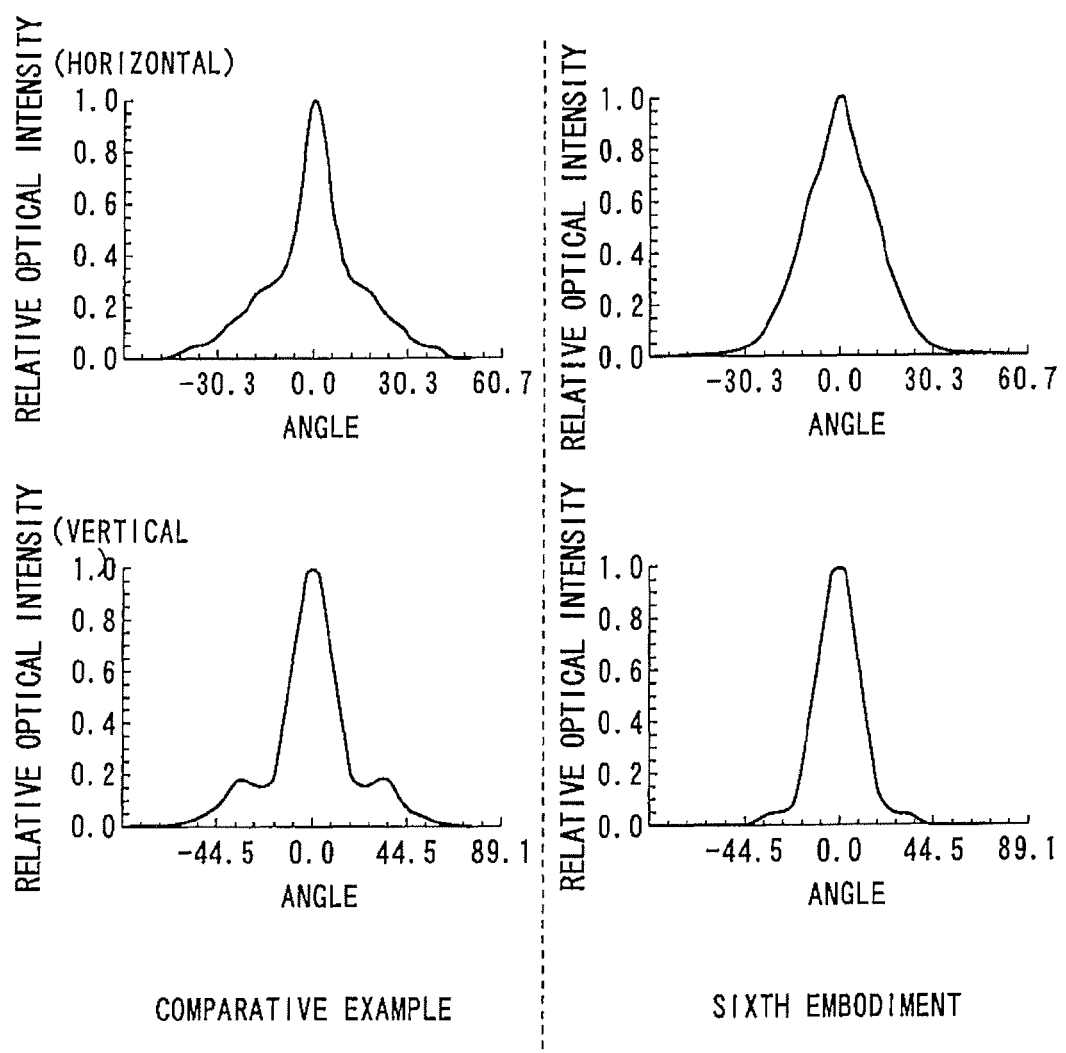
FIG. 45 is graphs showing the simulation results of the far-field images of the sixth embodiment and the comparative example.

FIG. 45 is graphs showing the simulation results of the far-field images of the sixth embodiment and the comparative example. It is seen that the sixth embodiment indicates that the far-field images in both the horizontal direction and the vertical direction show patterns close to Gaussian distribution. Therefore, since light efficiently bonds to optical fibers in the sixth embodiment, the lowering of optical output can be prevented.

Seventh Embodiment

Figure 46:
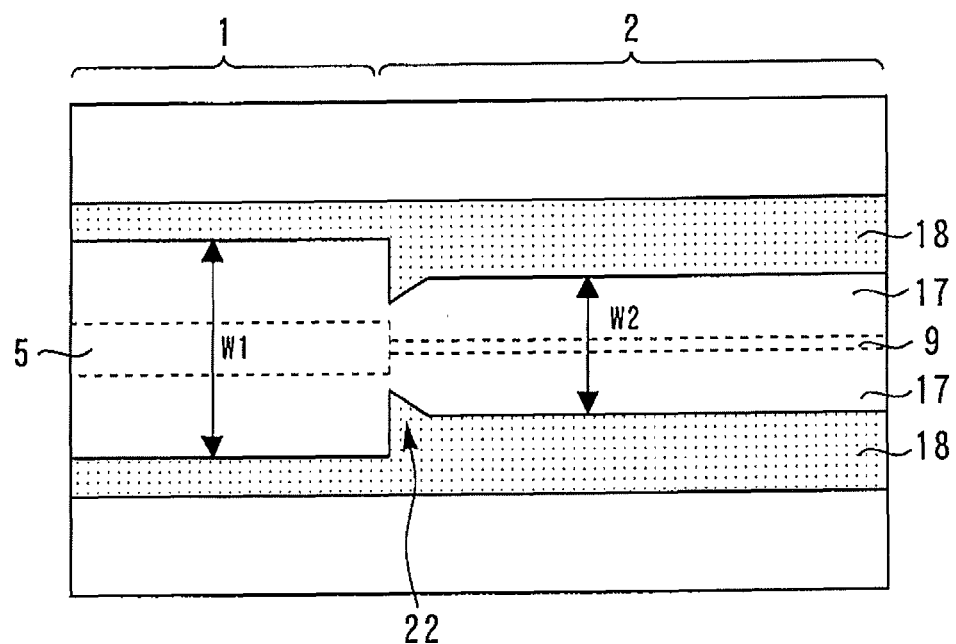
FIG. 46 is a top view showing an optical semiconductor device according to the seventh embodiment of the present invention.

FIG. 46 is a top view showing an optical semiconductor device according to the seventh embodiment of the present invention. In the same manner as in the second embodiment, the constricted portion 22 is provided in the vicinity of the light joining portion, and furthermore, in the same manner as in the fifth embodiment, the widths of the InGaAsP strain quantum well active layer 5 and the AlGaInAs quantum well optical waveguide layer 9 are changed to make the effective refractive indices agree. Thereby, the effects of the second embodiment and the fifth embodiment can be obtained.

Eighth Embodiment

Figure 47:
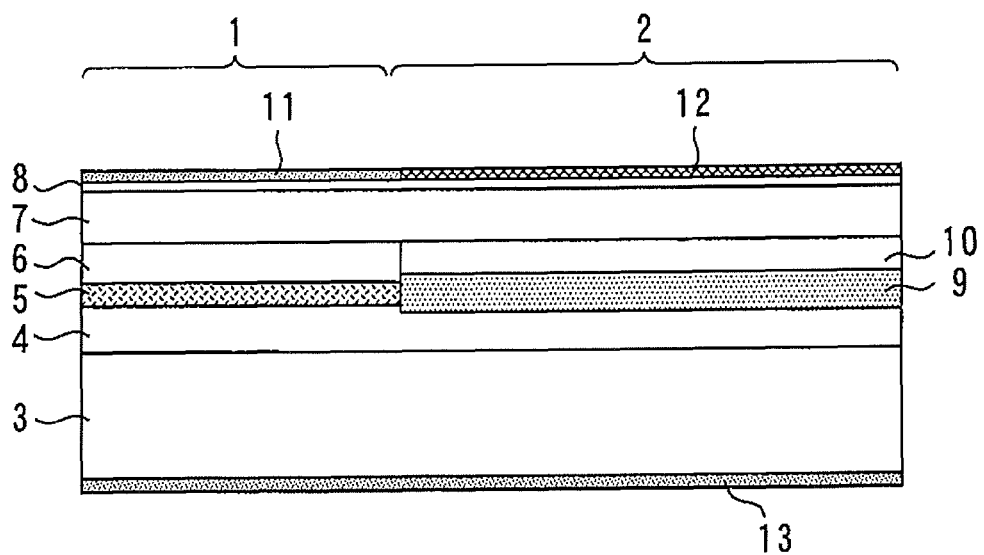
FIG. 47 is a sectional view in the resonator direction of the optical semiconductor device according to the eighth embodiment of the present invention.

FIG. 47 is a sectional view in the resonator direction of the optical semiconductor device according to the eighth embodiment of the present invention. In the present embodiment, the heights of the centers of the InGaAsP strain quantum well active layer 5 and the AlGaInAs quantum well optical waveguide layer 9 are agreed.

Figure 48:
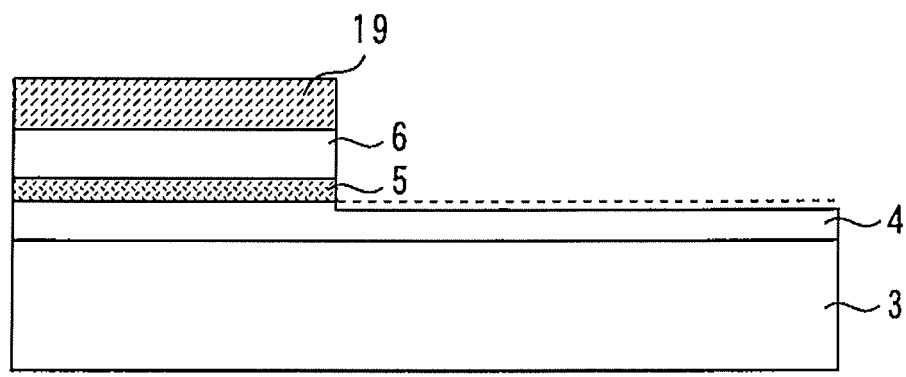
FIGS. 48 and 49 are drawings showing the fabricating processes of the optical semiconductor device according to the eighth embodiment of the present invention, and are sectional views in the resonator direction.
Figure 49:
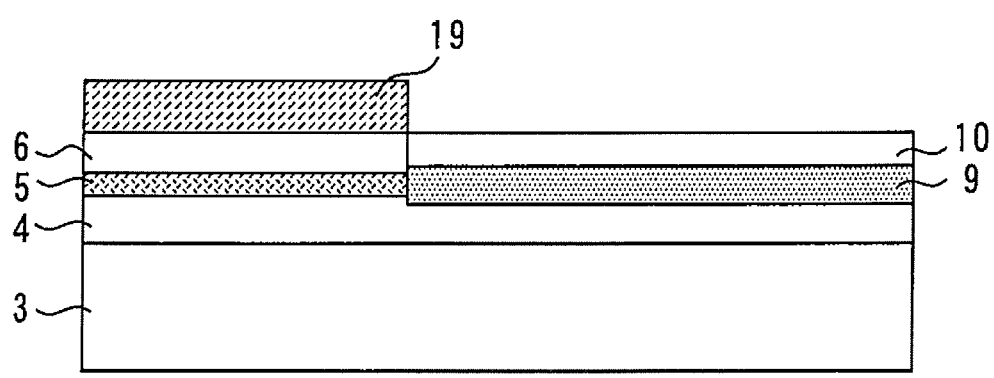

Next, the method for fabricating the above-described optical semiconductor device will be described. FIGS. 48 and 49 are drawings showing the fabricating processes of the optical semiconductor device according to the eighth embodiment of the present invention, and are sectional views in the resonator direction.

Firstly, the processes shown in FIGS. 5 to 7 are performed in the same manner as in the first embodiment. Next, as shown in FIG. 48, the N-type InP clad layer 4 is slightly dry-etched. At this time, the etching depth is the difference between the half of the thickness of the AlGaInAs quantum well optical waveguide layer 9 and the half of the thickness of the InGaAsP strain quantum well active layer 5.

Next, as shown in FIG. 49, an AlGaInAs quantum well optical waveguide layer 9 and a P-type InP clad layer 7 are formed in this order on the N-type InP clad layer 4 by the MOCVD method. At this time, since the N-type InP clad layer 4 is slightly removed by dry etching as described above, the heights of the centers of the InGaAsP strain quantum well active layer 5 and the AlGaInAs quantum well optical waveguide layer 9 agree. The following processes are identical to the processes in the first embodiment.

Since the thicknesses of the InGaAsP strain quantum well active layer 5 and the AlGaInAs quantum well optical waveguide layer 9 are different, the heights of the centers of the both in conventional devices do not agree. Therefore, there is a problem that light is scattered in the joining portion of the both, and the loss of light increases. Therefore, in the present embodiment, the heights of the centers in the InGaAsP strain quantum well active layer 5 and the AlGaInAs quantum well optical waveguide layer 9 are agreed. Thereby, the disturbance of light at the joining portions of the both is decreased. Therefore, the loss of light is decreased, and the lowering of light output can be prevented. However, similar effects can also be obtained by making the centers of optical intensity distribution of the InGaAsP strain quantum well active layer 5 and the AlGaInAs quantum well optical waveguide layer 9 agree.

Figure 50:
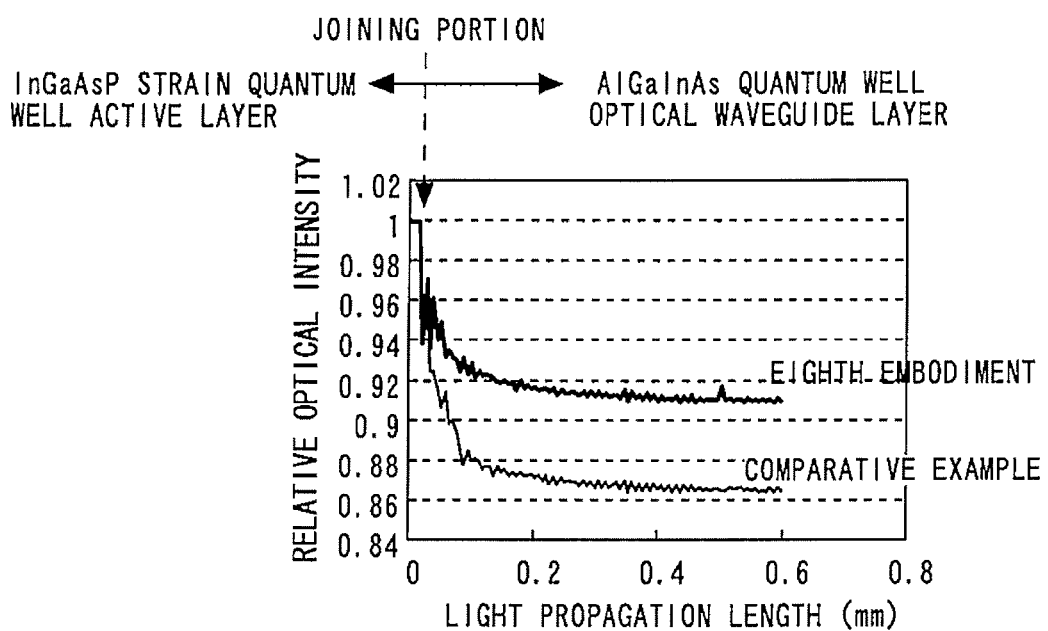
FIG. 50 is a graph showing the simulation results of the light propagation in the eighth embodiment and the comparative example.

FIG. 50 is a graph showing the simulation results of the light propagation in the eighth embodiment and the comparative example. In the eighth embodiment, it is seen that the light propagation loss is reduced by about 5% compared with the comparative example.

Furthermore, if it is tried to equalize the entire intensity distribution of light in the InGaAsP strain quantum well active layer 5 to the AlGaInAs quantum well optical waveguide layer 9, the optimal design of the InGaAsP strain quantum well active layer 5 and the AlGaInAs quantum well optical waveguide layer 9 becomes difficult. In the present embodiment, therefore, after optimally designing the InGaAsP strain quantum well active layer 5 and the AlGaInAs quantum well optical waveguide layer 9, the height of the centers of both, or the height of the centers of light intensity distribution is matched.

Ninth Embodiment

Figure 51:
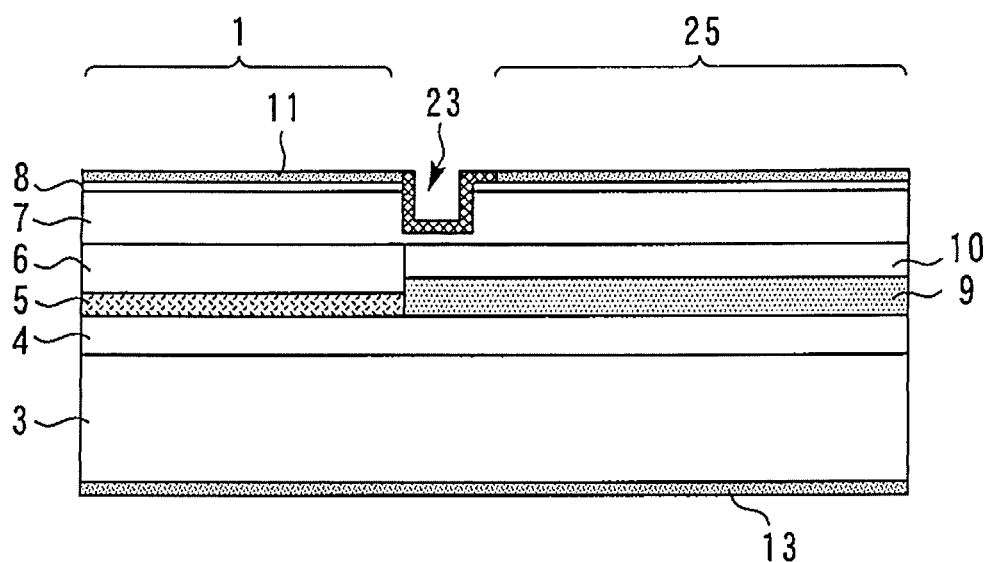
FIG. 51 is a sectional view showing an optical semiconductor device according to the ninth embodiment of the present invention in the resonator direction.

FIG. 51 is a sectional view showing an optical semiconductor device according to the ninth embodiment of the present invention in the resonator direction. A modulator 25 is provided on the portion of the optical waveguide 2 in the first to eighth embodiments. In this case too, the effect identical to the effects in the first to eighth embodiments can be obtained.

Tenth Embodiment

Figure 52:
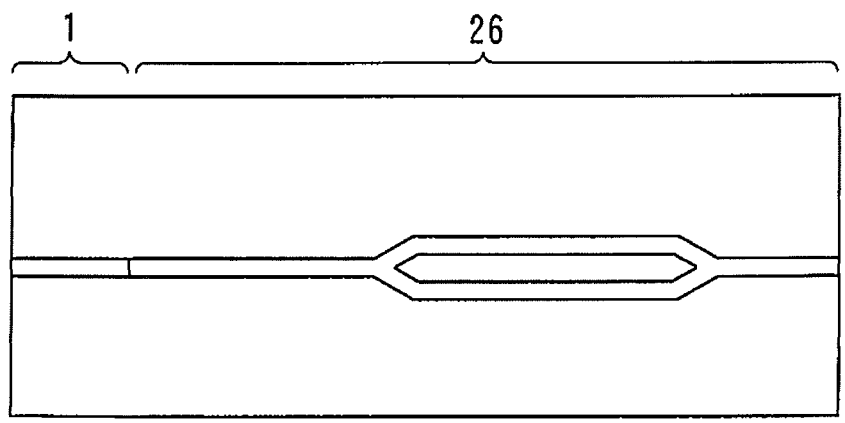
FIG. 52 is a top view showing an optical semiconductor device according to the tenth embodiment of the present invention.

FIG. 52 is a top view showing an optical semiconductor device according to the tenth embodiment of the present invention. A Mach-Zehnder modulator 26 is provided on the part of the optical waveguide 2 in the first to eighth embodiments. In this case too, a similar effect in the first to eighth embodiments can be obtained.

In the above described first to tenth embodiments, although the cases wherein an optical waveguide 2 is butt-joined to the semiconductor laser 1 were described, other optical semiconductor elements, such as a semiconductor optical amplifier can be used in place of the semiconductor laser 1. Furthermore, although the case wherein the optical waveguide 2 is made of an AlGaInAs quantum well layer was described, the optical waveguide 2 can be an InGaAsP quantum well layer composed of a layer structure different from the active layer 5 of the semiconductor laser 1.

In addition, two kinds of optical waveguides having different layer structures can be butt-joined. More specifically, the other optical waveguide can be butt-joined to the optical waveguide 2 in place of the semiconductor laser 1. In this case, another optical waveguide layer composed of a layer structure different from the AlGaInAs quantum well optical waveguide layer 9 is used in place of the InGaAsP strain quantum well active layer 5.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-258462, filed on Nov. 28, 2011, including specification, claims, drawings and summary, on which the Convention priority of the present application is based, is incorporated herein by reference in its entirety.

What is claimed is:

1. An optical semiconductor device comprising:
an optical semiconductor element, wherein the optical semiconductor element has a mesa structure having a mesa width and including an active layer, and a burying layer coating side faces of the active layer;
a first optical waveguide, wherein the first optical waveguide has a mesa structure having a mesa width and including a first optical waveguide layer, and having a layer structure different from the active layer of the optical semiconductor element, and a burying layer coating side faces of the first optical waveguide layer, wherein
the mesa width of the first optical waveguide is narrower than the mesa width of the optical semiconductor element, and
the optical semiconductor element is butt joined to the first optical waveguide; and
separating channels extending along opposite sides of the active layer and of the first optical waveguide layer, in the burying layers of the optical semiconductor element and the first optical waveguide, and defining the mesa structures between the separating channels so that separations between the separating channels are the mesa widths.

2. An optical semiconductor device comprising:
an optical semiconductor element, wherein the optical semiconductor element has a mesa structure having a mesa width and including an active layer, and a burying layer coating side faces of the active layer, and
an optical waveguide, wherein the optical waveguide has a mesa structure having a mesa width and including an optical waveguide layer, and a burying layer coating side faces of the optical waveguide layer, wherein
the optical waveguide has a different layer structure from the active layer of the optical semiconductor element,
the mesa width of the optical waveguide is narrower than the mesa width of the optical semiconductor element,
the optical semiconductor element is butt-joined to the optical waveguide; and
the mesa width of the optical waveguide, proximate joining of the optical semiconductor element to the optical waveguide, is narrower than the mesa width of the optical waveguide elsewhere in the optical waveguide.

3. An optical semiconductor device comprising:
an optical semiconductor element, wherein the optical semiconductor element has a mesa structure having a mesa width and including an active layer, and a burying layer coating side faces of the active layer,
an optical waveguide, wherein the optical waveguide has a mesa structure having a mesa width and including an optical waveguide layer, and a layer structure different from the active layer of the optical semiconductor element, and a burying layer coating side faces of the optical waveguide layer, wherein
the optical waveguide has a different layer structure from the active layer of the optical semiconductor element,
the mesa width of the optical waveguide is narrower than the mesa width of the optical semiconductor element, and
the optical semiconductor element is butt-joined to the optical waveguide; and
a dent portion located in an upper cladding layer of the optical waveguide proximate joining of the optical semiconductor element to the optical waveguide.

4. An optical semiconductor device comprising:
an optical semiconductor element; and
an optical waveguide butt-joined to the optical semiconductor element, wherein
the optical semiconductor element has a mesa structure including an active layer and a burying layer coating side faces of the active layer, and
the optical waveguide has a mesa structure including an optical waveguide layer having a layer structure different from the active layer, and a burying layer coating side faces of the optical waveguide layer; and
a dent portion located in an upper cladding layer of the optical waveguide, proximate joining of the optical semiconductor element to the optical waveguide.

5. The optical semiconductor device according to claim 3, wherein the dent portion is inclined to a resonator direction of the optical semiconductor element.

6. The optical semiconductor device according to claim 1, wherein the active layer and the first optical waveguide layer have different widths so that effective refraction indices of the active layer and the first optical waveguide layer match each other.

7. The optical semiconductor device according to claim 1, wherein centers or optical intensity distribution centers of the optical semiconductor element and the first optical waveguide are aligned.

8. The optical semiconductor device according to claim 6, wherein the active layer has an InGaAsP quantum well structure, and the first optical waveguide has an AlGaInAs quantum well structure.

9. An optical semiconductor device comprising:
an optical semiconductor element, wherein the optical semiconductor element has a mesa structure having a mesa width and including an active layer and a burying layer coating side faces of the active layer; and
an optical waveguide wherein the optical waveguide has a mesa structure having a mesa width includes an optical waveguide layer, has a layer structure different from the active layer of the optical semiconductor element, and includes a burying layer coating side faces of the optical waveguide layer, wherein
the optical semiconductor element is butt-joined to the optical waveguide, and
widths of the active layer and the optical waveguide layer are different so that effective refraction indices of the active layer and the optical waveguide layer match each other.

10. The optical semiconductor device according to claim 1, wherein the optical semiconductor element is a second optical waveguide, and the active layer of the optical semiconductor element is a second optical waveguide layer and the second optical waveguide has a layer structure different from the first optical waveguide.

11. The optical semiconductor device according to claim 1, wherein the separating channels are wider at the opposite sides of the optical waveguide than at the opposite sides of the optical semiconductor element.

12. The optical semiconductor device according to claim 2, wherein the active layer and the optical waveguide layer have different widths so that effective refraction indices of the active layer and the optical waveguide layer match each other.

13. The optical semiconductor device according to claim 12, wherein the active layer has an InGaAsP quantum well structure, and the optical waveguide has an AlGaInAs quantum well structure.

14. The optical semiconductor device according to claim 9, wherein the mesa width of the optical waveguide, proximate joining of the optical semiconductor element to the optical waveguide, is narrower than the mesa width of the optical waveguide elsewhere in the optical waveguide.

* * * * *